(12) United States Patent
Kuo et al.

(10) Patent No.: US 11,664,483 B2
(45) Date of Patent: May 30, 2023

(54) LIGHT EMITTING DEVICE, PACKAGE DEVICE AND METHOD OF LIGHT EMITTING DEVICE MANUFACTURING

(71) Applicant: Lextar Electronics Corporation, Hsinchu (TW)

(72) Inventors: Shiou-Yi Kuo, Hsinchu (TW);
Jian-Chin Liang, Hsinchu (TW);
Jo-Hsiang Chen, Hsinchu (TW);
Chih-Hao Lin, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 209 days.

(21) Appl. No.: 17/078,098

(22) Filed: Oct. 23, 2020

(65) Prior Publication Data

US 2021/0328120 A1    Oct. 21, 2021

(30) Foreign Application Priority Data

Apr. 16, 2020   (CN) .......................... 202010300085.0

(51) Int. Cl.
| | |
|---|---|
| *H01L 33/62* | (2010.01) |
| *H01L 33/00* | (2010.01) |
| *H01L 33/54* | (2010.01) |
| *H01L 25/075* | (2006.01) |
| *H01L 25/16* | (2006.01) |
| *H01L 33/50* | (2010.01) |
| *H01L 33/38* | (2010.01) |
| *H01L 33/48* | (2010.01) |

(52) U.S. Cl.
CPC ............ *H01L 33/62* (2013.01); *H01L 33/005* (2013.01); *H01L 33/54* (2013.01); *H01L 2933/005* (2013.01); *H01L 2933/0066* (2013.01)

(58) Field of Classification Search
CPC ..... H01L 33/0093; H01L 33/54; H01L 33/38; H01L 2933/005; H01L 25/167
See application file for complete search history.

(56) References Cited

U.S. PATENT DOCUMENTS

| | | | |
|---|---|---|---|
| 5,286,335 A | | 2/1994 | Drabik et al. |
| 2021/0305464 A1* | | 9/2021 | Hemer ................... H01L 27/15 |

FOREIGN PATENT DOCUMENTS

| | | |
|---|---|---|
| CN | 101477955 A | 7/2009 |
| CN | 107507821 A | 12/2017 |
| CN | 207852728 U | 9/2018 |
| CN | 109473458 A | 3/2019 |

(Continued)

*Primary Examiner* — Antonio B Crite
(74) *Attorney, Agent, or Firm* — CKC & Partners Co., LLC

(57) ABSTRACT

A light-emitting device includes a micro light-emitting diode chip (micro LED chip), a first electrical connecting layer, a second electrical connecting layer and a housing layer. The micro LED chip includes a light exit surface, a bottom surface opposite to the light exit surface and first and second electrodes located on the bottom surface. The first and second electrical connecting layers respectively connect to the first and second electrodes and extend along two opposite sidewalls to two sides of a perimeter of the light exit surface. The housing layer encloses the micro LED chip and the first and second electrical connecting layer. The light exit surface of the micro LED chip and top surfaces of the first and second electrical connecting layers are not enclosed by the housing layer.

19 Claims, 22 Drawing Sheets

(56) References Cited

FOREIGN PATENT DOCUMENTS

| CN | 110211888 A | 9/2019 | | |
|---|---|---|---|---|
| JP | 2004363279 A | 12/2004 | | |
| TW | I635605 B | 9/2018 | | |
| WO | WO-2021184257 A1 | * | 9/2021 | ............. H01L 27/15 |

* cited by examiner

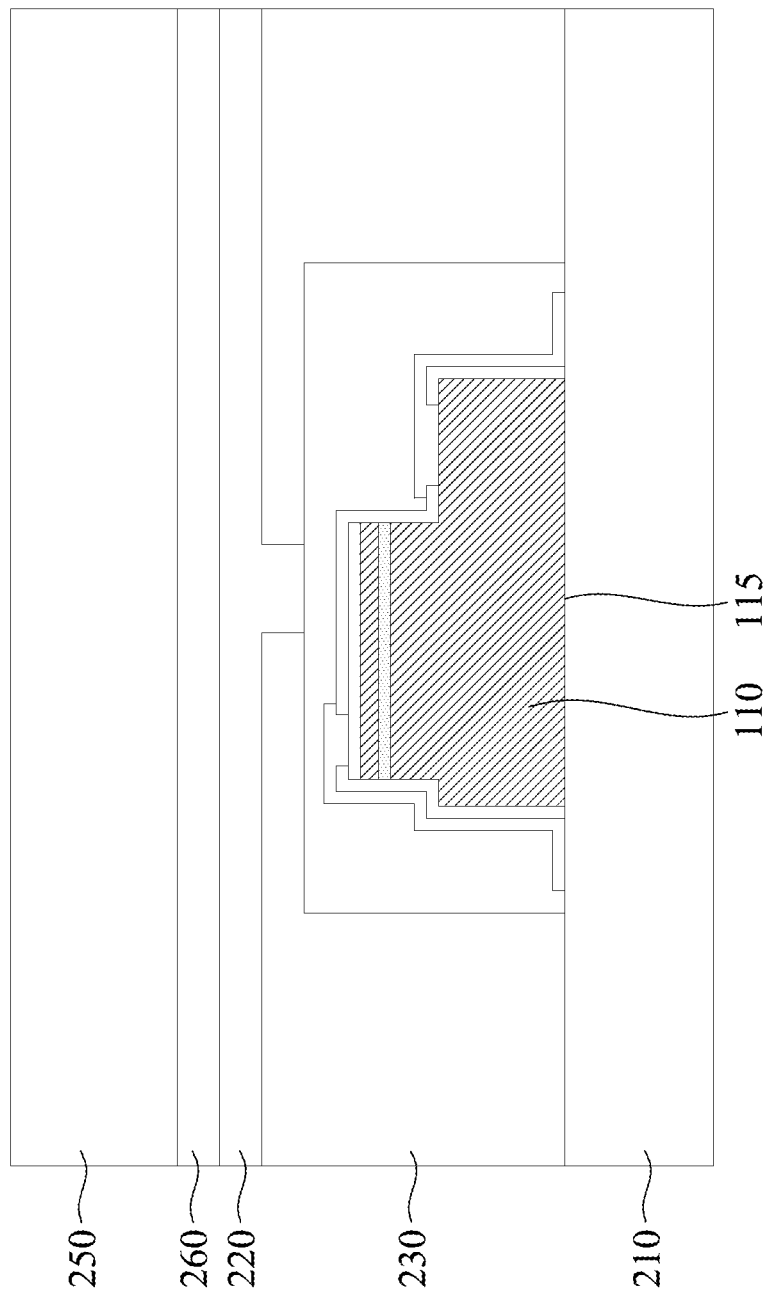

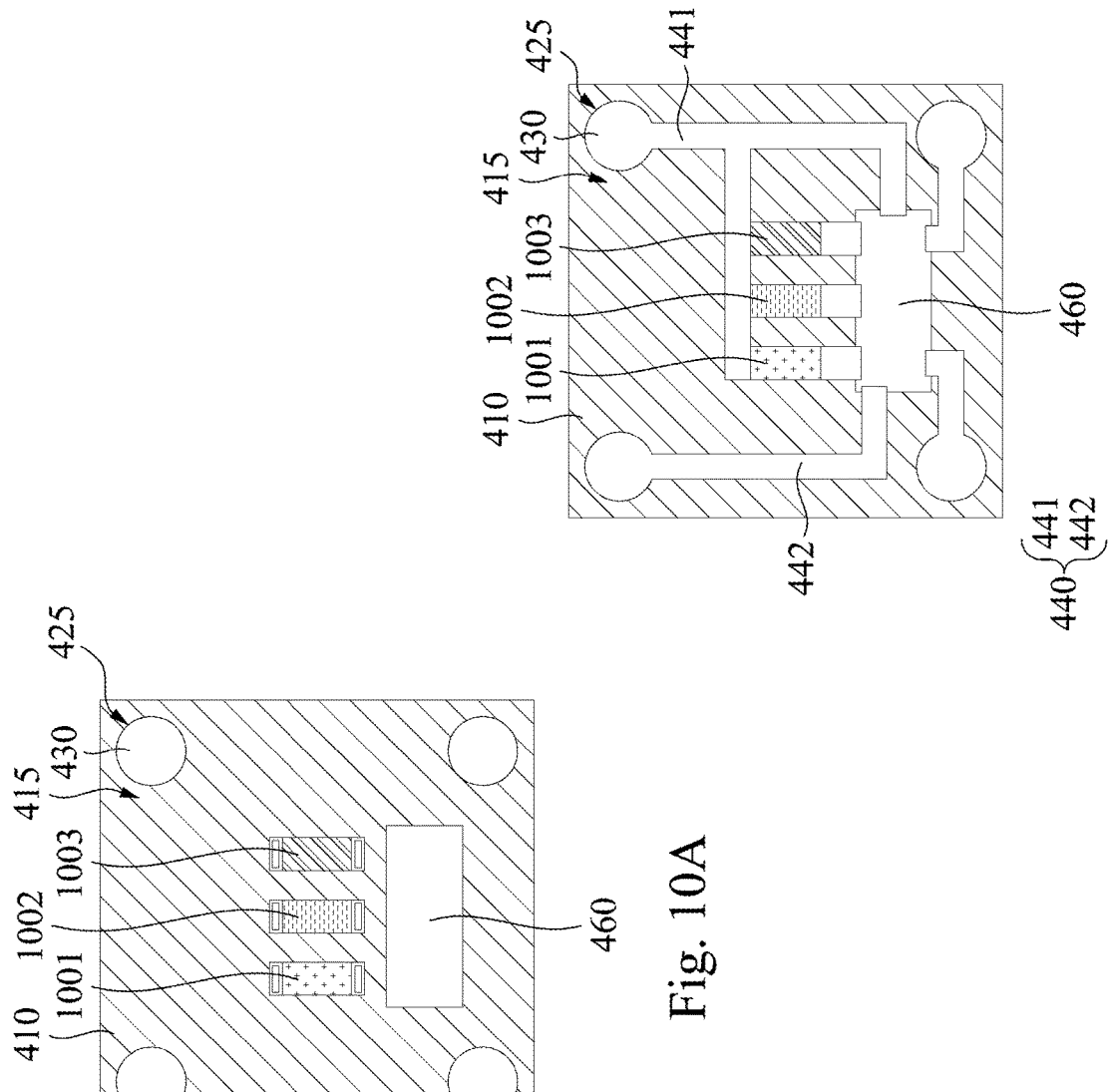

LIGHT EMITTING DEVICE, PACKAGE DEVICE AND METHOD OF LIGHT EMITTING DEVICE MANUFACTURING

RELATED APPLICATIONS

This application claims priority to China Application Serial Number 202010300085.0, filed Apr. 16, 2020, which is herein incorporated by reference in its entirety.

BACKGROUND

Technical Field

The present disclosure relates to a light-emitting device, a package device and a method of light-emitting device manufacturing.

Description of Related Art

In the conventional light-emitting diode (LED) package devices, the thickness and width of the overall LED package devices have certain limitations because of the use of a certain thickness of substrate and corresponding size of LED chips. Therefore, applications in wearable devices or high-density LED displays that pursue fine pitch would also be limited.

Accordingly, how to reduce the size and thickness of the light-emitting package device to reduce the overall size is one of the subjects that need to be solved by those skilled in the art.

SUMMARY

One aspect of the present disclosure is related to a light-emitting device.

According to one embodiment of the present disclosure, a light-emitting device includes a micro light-emitting diode chip (micro LED chip), a first electrical connecting layer, a second electrical connecting layer and a housing layer. The micro LED chip includes a light exit surface, a bottom surface opposite to the light exit surface and a first electrode and a second electrode located on the bottom surface. The first and second electrical connecting layers respectively connect to the first and second electrodes and extend along two opposite sidewalls to two sides of a perimeter of the light exit surface. The housing layer encloses the micro LED chip and the first and second electrical connecting layers. The light exit surface of the micro LED chip and top surfaces of the first and second electrical connecting layers are not enclosed by the housing layer.

In one or more embodiments of the present disclosure, the first and second electrical connecting layers respectively have a first conductive pad and second conductive pad being coplanar with the light exit surface. Top surfaces of the first and second conductive pads are not enclosed by the housing layer.

In one or more embodiments of the present disclosure, the micro LED chip has no substrate.

In one or more embodiments of the present disclosure, the mentioned light-emitting device includes a first insulating layer located between the first electrical connecting layer and the micro LED chip and a second insulating layer located between the second electrical connecting layer and the micro LED chip.

In one or more embodiments of the present disclosure, the light exit surface includes a roughened surface.

In one or more embodiments of the present disclosure, the bottom surface includes a first bottom surface and a second bottom surface, and a step height exists between the first and second bottom surfaces. The first and second electrodes are respectively located on the first and second bottom surfaces.

In one or more embodiments of the present disclosure, the micro LED chip includes a protruding structure. The protruding structure has a height different from a height of the first or second electrical connecting layer. The light exit surface is located on a surface of the protruding structure.

In some embodiments, the bottom surface has a vertical projection on the protruding structure. A portion of the protruding structure corresponding to the vertical projection is a roughened surface.

In one or more embodiments of the present disclosure, the mentioned light-emitting device further includes a bottom plate and a breakable supporting structure. The breakable supporting structure connects a bottom surface of the housing layer and the bottom plate. The breakable supporting structure is located between the bottom surface of the housing layer and the bottom plate.

Another aspect of the present disclosure is related to a package device.

According to one embodiment of the present disclosure, the package device includes a circuit board, at least one light-emitting device and a protecting layer. The circuit board includes an upper surface and a lower surface opposite to the upper surface. The at least one light-emitting device is located on the upper surface of the circuit board. Each light-emitting device includes a micro light-emitting diode chip (micro LED chip), a first electrical connecting layer, a second electrical connecting layer and a housing layer. The micro LED chip includes a light exit surface, a bottom surface opposite to the light exit surface and a first electrode and a second electrode located on the bottom surface. The first and second electrical connecting layers respectively connect to the first and second electrodes and extend along two opposite sidewalls to two sides of a perimeter of the light exit surface. The housing layer encloses the micro LED chip and the first and second electrical connecting layer. The light exit surface of the micro LED chip and top surfaces of the first and second electrical connecting layers are not enclosed by the housing layer. The protecting layer covers the light exit surface of the micro LED chip. The housing layer of the at least one light-emitting device is located between the micro LED chip of the at least one light-emitting device and an upper surface of the circuit board. The at least one light-emitting device is electrically connected to the circuit board through the corresponding first and second electrical connecting layers.

In one or more embodiments of the present disclosure, the circuit board includes a first circuit layer on the upper surface. The first circuit layer extends along two sides of the housing layer of the at least one light-emitting device to top surfaces of the first and second electrical connecting layers respectively.

In one or more embodiments of the present disclosure, the circuit board further includes a second circuit layer on the lower surface and conductive through holes between the first and second circuit layers.

In some embodiments, the first circuit layer includes a common first-type electrode wire and a plurality of second-type electrode wires. The common first-type electrode wire is insulated form the second-type electrode wires.

In some embodiments, the number of the at least one light-emitting device is plural. The common first-type electrode wire is connected to the top surfaces of the first electrical connecting layers of the light-emitting devices, and the second-type electrode wires are respectively connected to the top surfaces of the second electrical connecting layer of the light-emitting devices.

In some embodiments, the mentioned package device further includes at least one active device. The at least one active device is located on the circuit board. Each active device includes third and fourth electrical connecting layers, the common first-type electrode wire connects the third electrical connecting layer of the at least one active device and the first electrical connecting layer of the at least one light-emitting device. The second-type electrode wires respectively connects the fourth electrical connecting layer of the at least one active device and the second electrical connecting layer of the at least one light-emitting device.

In one or more embodiments of the present disclosure, the mentioned package device further includes a driving chip used to control the light-emitting device.

In one or more embodiments of the present disclosure, a top surface of the protecting layer is opposite to the light exit surface, and the top surface of the protecting layer is a roughened surface.

In one or more embodiments of the present disclosure, the protecting layer has a plurality of diffusion particles and/or wavelength conversion materials.

In one or more embodiments of the present disclosure, the mentioned package device further includes an opaque layer located between the protecting layer and the circuit board. The opaque layer does not cover the at least one light-emitting device, and the opaque layer is a dark or black material.

Another aspect of the present disclosure is a method of light-emitting device manufacturing.

According to one embodiment of the present disclosure, the method of light-emitting device manufacturing includes following operations. A micro light-emitting diode chip (micro LED chip) is located on a first bottom plate, wherein the micro LED chip comprises a light exit surface and an opposite bottom surface, the light exit surface is connected to the first bottom plate, and the bottom surface comprises two electrodes. Respectively connect the first electrical connecting layer and the second electrical connecting layers to the two electrodes on the bottom surface, wherein the first and second electrical connecting layer respectively extend to a perimeter of the light exit surface. Cover a housing layer to the micro LED chip, wherein the micro LED chip, the first and second electrical connecting layers and the housing layer form a light-emitting device. Cover a sacrificial layer to the housing layer, wherein the sacrificial layer has a top surface opposite to the first bottom plate, the sacrificial layer has an opening located on the top surface, the opening is aligned with the micro LED chip, and the opening extends from the top surface of the sacrificial layer to the housing layer, covering a supporting structure layer on the sacrificial layer and filling the supporting structure layer within the opening to form a supporting structure connected to the housing layer. A second bottom plate is connected to the supporting structure layer. The first bottom plate is removed to expose the light exit surface.

In one or more embodiments of the present disclosure, the method further includes following operations. Disconnect the housing layer of the light-emitting device and the breakable supporting structure and transfer the light-emitting device to a receiving board.

In summary, the light-emitting device of the present disclosure uses small-sized micro light-emitting diodes, and the overall size and thickness can be reduced. The conductive circuit of the light-emitting device coplanar with the light exit surface of the micro LED, which is beneficial for connection with other conductive wires. The package device using the mentioned light-emitting device can also have a reduced size.

The above description is only used to explain the problems to be solved by the present disclosure, the technical means for solving the problems and the produced effects. The specific details of the present disclosure are described in detail in the following embodiments and related drawings.

BRIEF DESCRIPTION OF THE DRAWINGS

The drawings disclose one or more embodiments of the present disclosure and, together with the explanation in the description, serve to explain the principles of the present disclosure. Wherever possible, the same reference numbers will be used throughout the drawings to refer to the same or like elements in the embodiments. These drawings include:

FIGS. 3A-3H are cross-section views in different operations of the method illustrated in FIG. 2;

FIGS. 10A-10C illustrate top views in different operations of another method of manufacturing a package device according to another embodiment of the present disclosure;

DETAILED DESCRIPTION

The following embodiments are disclosed with accompanying diagrams for a detailed description. For illustration clarity, many details are explained in the following description. However, it should be understood that these details do not limit the present disclosure. That is, these details are not necessary in parts of embodiments of the present disclosure. Furthermore, for simplifying the drawings, some of the conventional structures and elements are shown with schematic illustrations. Also, the same labels may be regarded as the corresponding components in the different drawings unless otherwise indicated. The drawings are drawn to clearly illustrate the connection between the various components in the embodiments, and are not intended to depict the actual sizes of the components.

In addition, terms used in the specification and the claims generally have their usual meaning as used in the field, in the context of the disclosure and in the context of the particular content unless particularly specified otherwise. Some terms used to describe the disclosure are discussed below or elsewhere in the specification to provide additional guidance related to the description of the disclosure to those in the art.

The phrases "first," "second," etc., are solely used to separate the descriptions of elements or operations with the same technical terms, and are not intended to convey a meaning of order or to limit the disclosure.

Additionally, the phrases "comprising," "includes," "provided," and the like, are all open-ended terms, i.e., meaning including but not limited to.

Further, as used herein, "a" and "the" can generally refer to one or more unless the context particularly specifies otherwise. It will be further understood that the phrases "comprising," "includes," "provided," and the like used herein indicate the stated characterization, region, integer, step, operation, element and/or component, and does not exclude additional one or more other characterizations, regions, integers, steps, operations, elements, components and/or groups thereof.

Figure 1A:
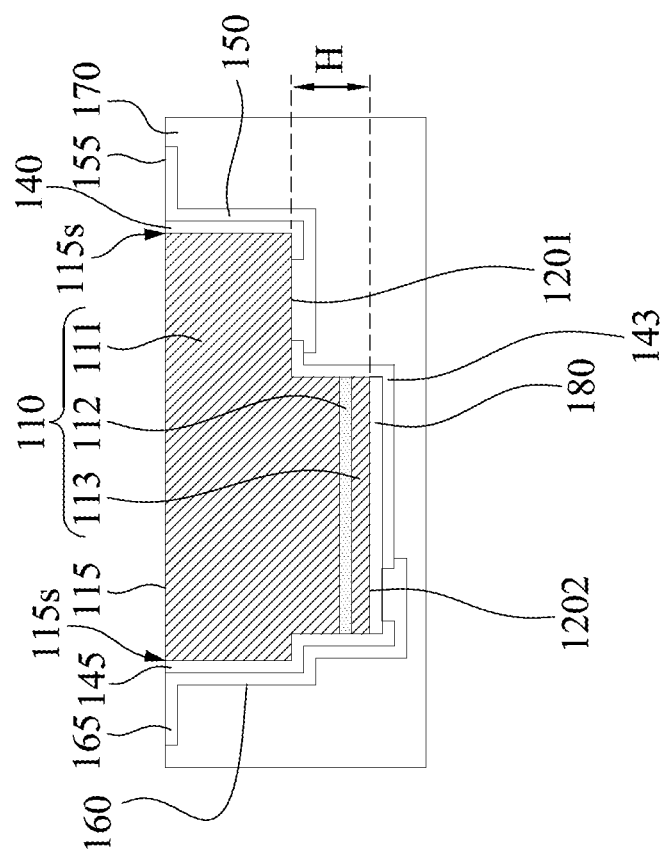
FIG. 1A illustrates a cross-section view of a light-emitting device according to one embodiment of the present disclosure.

As shown in FIG. 1A, a light-emitting device 100 includes a micro light-emitting diode (micro LED) chip 110, an electrical connecting layer 150, an electrical connecting layer 160 and a housing layer 170. The micro LED chip 110 includes a light exit surface 115 and a bottom surface 120 opposite to the light exit surface 115. The light emitted by the micro LED chip 110 can go through the light exit surface 115. The electrical connecting layer 150 and the electrical connecting layer 160 respectively extend from the bottom surface 120 of the micro LED chip 110 and along two opposite side walls of the micro LED chip 110 to the peripheries on two sides of the light exit surface 115 of the light-emitting device 100. An insulating layer 145 used for preventing unexpected conduction is provided between the electrical connecting layer 150 and the micro LED chip 110. Similarly, an insulating layer 140 is provided between the electrical connecting layer 160 and the micro LED chip 110. In addition, the electrical connecting layer 150 has a conductive pad 155, and the electrical connecting layer 160 has a conductive pad 165. The conductive pad 155 and the conductive pad 165 are respectively adjacent to the peripheral edges 115s on two sides of the light exit surface 115. The conductive pad 155 and the conductive pad 165 are substantially coplanar with the light exit surface 115. The housing layer 170 is provided to cover a part beyond the light exit surface 115 of the micro LED chip 110 to protect the micro LED chip 110. At the same time, in this embodiment, the top surfaces of the electrical connecting layer 150 and the electrical connecting layer 160 are not covered by the housing layer 170.

An advantage of a micro LED is that a size of the micro LED is less than a size of a conventional light-emitting diode. In some embodiments, the micro LED can be defined by the size, and the size of the micro light-emitting diode is about 1 μm to 100 μm. In this embodiment, the micro LED chip 110 is substantially without a substrate, for example, the micro LED chip 110 does not have a sapphire substrate. As shown in FIG. 1A, the micro LED chip 110 includes a first semiconductor layer 111, a second semiconductor layer 113, and an active layer 112 located between the first semiconductor layer 111 and the second semiconductor layer 113. The active layer 112 between the first semiconductor layer 111 and the second semiconductor layer 113 can emit light after conducting current. Furthermore, since the micro LED chip 110 has no substrate, the size and thickness of the micro LED chip 110 can be reduced. In this way, in this embodiment, the overall thickness of the light-emitting device 100 can be less than 20 μm.

In some embodiments, for example, the first semiconductor layer 111 cam be a p-type semiconductor, the second semiconductor layer 113 can be an n-type semiconductor, and the p-type first semiconductor layer 111 and the n-type second semiconductor layer 113 forms the micro LED chip 110, and the active layer 112 between the first semiconductor layer 111 and the second semiconductor layer 113 can emit light due to the conduction of current.

The micro LED chip 110 includes a light exit surface 115 and a bottom surface 120 opposite to the light exit surface 115. As shown in FIG. 1A, in this embodiment, the bottom surface 120 includes a first bottom surface 1201 and a second bottom surface 1202. The first bottom surface 1201 and the second bottom surface 1202 respectively correspond to the first semiconductor layer 111 and the second semiconductor layer 113. In this embodiment, a first electrode is provided on the first bottom surface 1201, and a second electrode is provided on the second bottom surface 1202. By connecting the first electrode and the second electrode, the active layer 112 between the first semiconductor layer 111 and the second semiconductor layer 113 of the micro LED chip 110 can flow current, so that the micro LED chip 110 emits light. The light emitted by the micro LED chip 110 can be emitted from the light exit surface 115. In this embodiment, the first bottom surface 1201 and the second bottom surface 1202 are not coplanar, and there is a step height H between the first bottom surface 1201 and the second bottom surface 1202. In some embodiments, the first bottom surface 1201 and the second bottom surface 1202 can also be coplanar.

As shown in FIG. 1A, in this embodiment, the micro LED chip 110 further includes a passivation layer 180 covering a surface of the second semiconductor layer 113. The disposition of the passivation layer 180 would not affect the electrical connection between the electrical connecting layer 160 and the second electrode on the second bottom surface 1202. In some embodiments, the passivation layer 180 includes a Distributed Bragg Reflector (DBR), which can be used to reflect the light emitted by the micro LED chip 110 to further enhance the intensity of the light emitted from the light exit surface 115 of the micro LED chip 110.

As shown in FIG. 1A, the electrical connecting layer 150 and the electrical connecting layer 160 are respectively connected to the first electrode located on the first bottom surface 1201 and the second electrode located on the second bottom surface 1202. The electrical connecting layer 150 and the electrical connecting layer 160 extend along the two opposite side walls of the micro LED chip 110 to the peripheral edges 115s on two sides of the light exit surface 115 of the light-emitting device 100. The insulating layer 140 is located between the electrical connecting layer 150 and the micro LED chip 110. Therefore, the electrical connecting layer 150 and the micro LED chip 110 are conducted through only the first electrode on the first bottom surface 1201 to avoid other unexpected conduction. The insulating layer 143 is located between the first electrode and the second electrode of the micro LED chip 110. As shown in FIG. 1A, the insulating layer 143 covers the remaining part, which is not covered by the electrical connecting layer 150, of the first semiconductor layer 111 that and extends along the exposed sidewalls of the first semiconductor layer 111, the active layer 112, the second semiconductor layer 113, and the passivation layer 180 of the micro LED chip extend to a part of the surface of the passivation layer 180. It can also avoid unexpected conduction. The insulating layer 145 is located between the electrical connecting layer 160 and the micro LED chip 110, so that the electrical connecting layer 160 and the micro LED chip 110 are conducted through only the second electrode on the second bottom surface 1202, and it also avoids that the electrical connecting layer 160 is connected to the first semiconductor layer 111, thereby preventing current from not flowing in the light-emitting area (active layer 112) between the two semiconductor blocks (the semiconductor layers 111 and 113) of the micro-LED chip 110, which causes the micro LED chip 110 to not emit light.

The insulating layer 140 covers a part of the surface of the first semiconductor layer 111 from the first bottom surface 1201. The insulating layer 140 also extends along the sidewall of the first semiconductor layer 111 to the peripheral edge 115s of the light exit surface 115. The insulating layer 145 extends from the surface of a part of the passivation layer 180 on the second bottom surface 1202 and along the sidewalls of the passivation layer 180, the second semiconductor layer 113, the active layer 112, and the first semiconductor layer 111 to peripheral edge 115s of the light exit surface 115. The electrical connecting layer 150 and the electrical connecting layer 160 respectively extend from the two electrodes on the first bottom surface 1201 and the second bottom surface 1202 to the peripheral edge 115s of the light exit surface 115, so as to separate the insulating layer 140 and the insulating layer 145 from the peripheral edge 115s respectively adjacent. Specifically, on the plane of the light exit surface 115 of the micro LED chip 110, the conductive pad 165 extending from the electrical connecting layer 160 and the conductive pad 155 extending from the electrical connecting layer 150 are arranged adjacent to the light exit surface 115. The conductive pad 165 and the conductive pad 155 are coplanar with the light exit surface 115. The conductive pad 165 and the conductive pad 155 can be used to connect other electrical connecting wires. Since the conductive pad 165 and the conductive pad 155 are coplanar with the light exit surface 115, when the light-emitting device 100 is subsequently transferred to another circuit board (such as the circuit board 410 of following FIG. 7A), it is convenient to connect with other electrical connecting lines.

In this embodiment, the housing layer 170 covers the micro LED chip 110, the electrical connecting layer 160 and the electrical connecting layer 150. The light exit surface 115 of the micro LED chip 110 and top surfaces of the electrical connecting layer 160 and the electrical connecting layer 150 are not covered by the housing layer 170. The top surfaces of the electrical connecting layer 160 and the electrical connecting layer 150 respectively extend to top surfaces of the conductive pad 165 and the conductive pad 155, which are coplanar with the light exit surface 115. The housing layer 170 can protect most of an area of the micro LED chip 110. The housing layer 170 can further prevent the electrical connecting layer 160 and the electrical connecting layer 150 from being damaged or short. In some embodiments, the material of the housing layer 170 includes a high-temperature-resistant polymer dielectric material, such as benzocyclobutene (BCB).

Figure 1B:
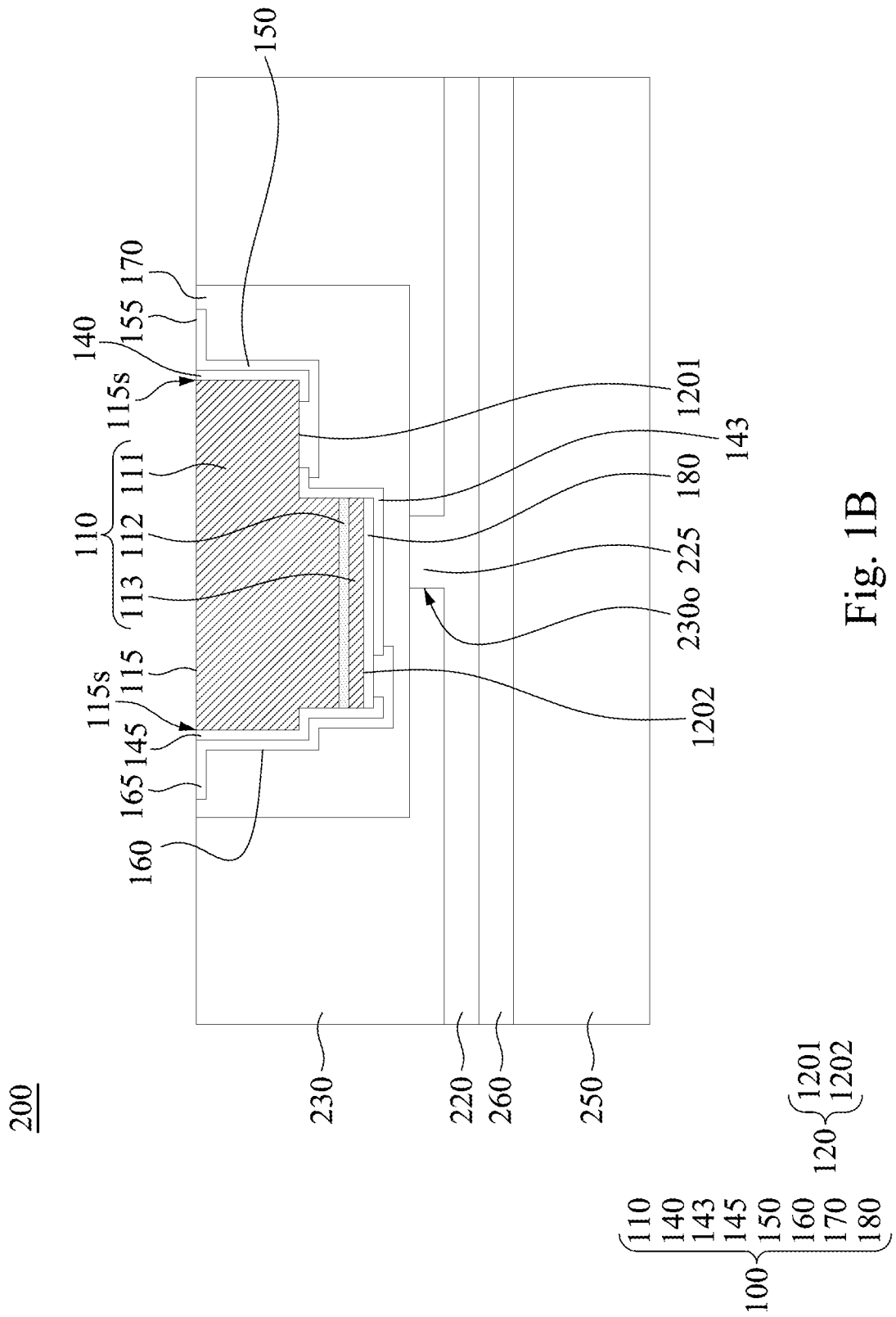
FIG. 1B illustrates a cross-section view of a light-emitting structure having a light-emitting device according to one embodiment of the present disclosure.

Reference is made by FIG. 1B. FIG. 1B illustrates a cross-section view of a light-emitting structure 200 having a light-emitting device 100 according to one embodiment of the present disclosure.

In FIG. 1B, the light-emitting device 100 is located in the light-emitting structure 200. The light-emitting structure 200 emits light through the light-emitting device 100. The light-emitting structure 200 is a middle-structure produced by manufacturing the light-emitting device 100. As shown in FIG. 1B, the light-emitting structure 200 includes a bottom plate 250, a supporting structure layer 220, a first sacrificial layer 230 and a connecting layer 260. The light-emitting device 100 is substantially connected to the bottom plate 250 through the supporting structure 225 of the supporting structure layer 220. To further explain the manufacture of the light-emitting device 100, please refer to the following discussion.

Figure 2:
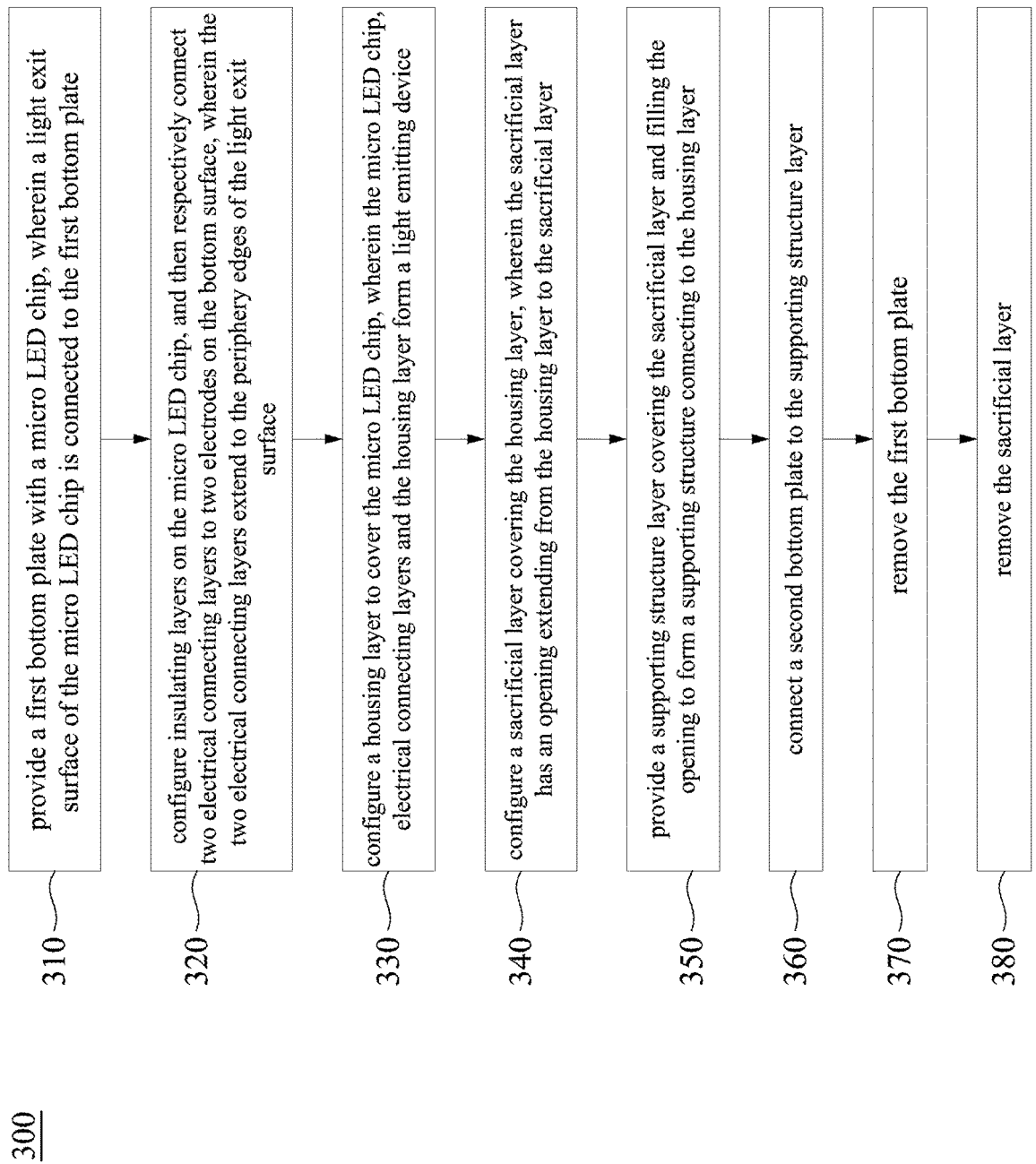
FIG. 2 is a flowchart of a method of manufacturing a light-emitting device according to one embodiment of the present disclosure.

FIG. 2 is a flowchart of a method 300 of manufacturing a light-emitting device 100 according to one embodiment of the present disclosure. To further illustrate the manufacturing process of the light-emitting device 100, please refer to FIGS. 3A to 3H. FIGS. 3A-3H are cross-section views in different operations of the method 300 illustrated in FIG. 2.

Figure 3A:
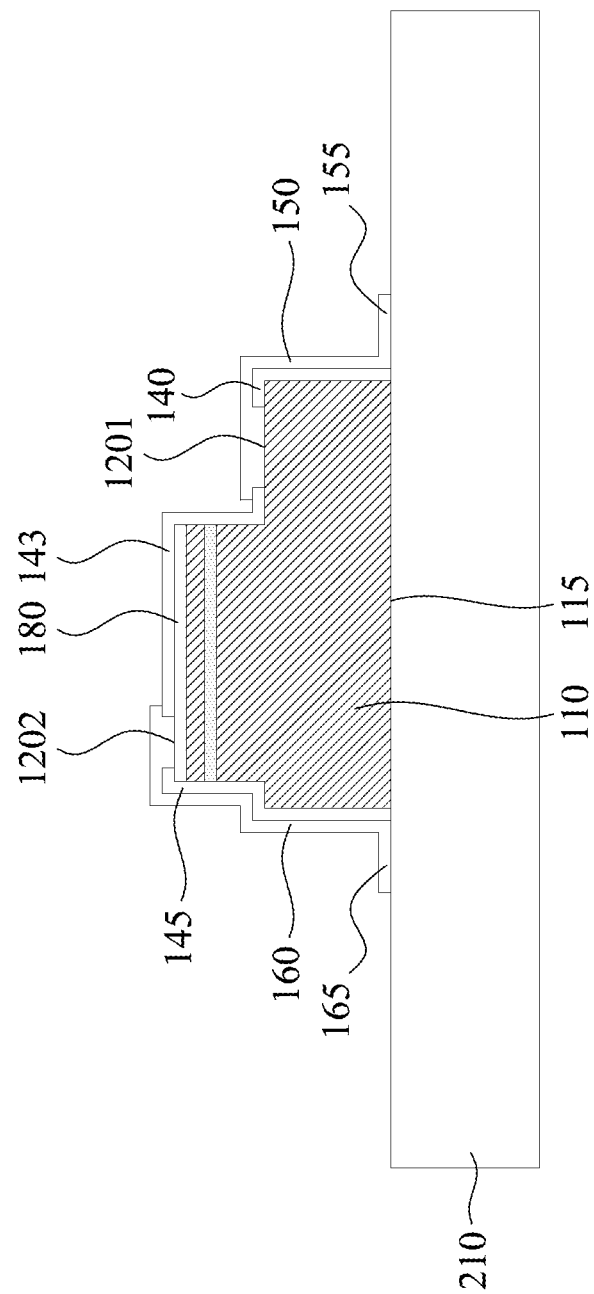

In the operation 310 and referring to FIG. 3A, provide a first bottom plate 210 with a micro LED chip 110, wherein light exit surface 115 of the micro LED chip 110 is connected to the first bottom plate 210. In other words, in some embodiments, the micro LED chip 110 can be formed on the bottom plate 210. In the following operations, the micro LED chip 110 can be removed from the bottom plate 210. Therefore, the formed micro LED chip 110 does not have a substrate. In some embodiments, material of the bottom plate 210 can be sapphire.

As shown in FIG. 3A, the micro LED chip 110 is located on the bottom plate 210, and required components can be located on the bottom surface 120 (including the A bottom surface 1201 and a second bottom surface 1202) opposite to the light exit surface 115 since the light exit surface 115 of the micro LED chip 110 is connected to the bottom plate 210. The, enter the operation 320. As shown in FIG. 3A, configure insulating layers 140, 143, and 145 on the micro LED chip 110, and then respectively connect an electrical connecting layer 150 and an electrical connecting layer 160 to the first electrode and the second electrode on the first bottom surface 1201 and the second bottom surface 1202. In addition, the electrical connecting layer 160 and the electrical connecting layer 150 respectively extend along the opposite side walls of the micro LED chip 110 to the peripheral edges 115s of the light exit surface 115, and the electrical connecting layer 160 and the electrical connecting layer 150 respectively connect to the conductive pads 165 and 155 formed on the surface of the bottom plate 210. Therefore, the conductive pad 165 and the conductive pad 155 can be coplanar with the light exit surface 115. In some embodiments, grooves can be located on the surface of the bottom plate 210, so that the light exit surface 115 contacting the bottom plate 210 can have different shapes. For details, please refer to the following discussion.

Figure 3B:
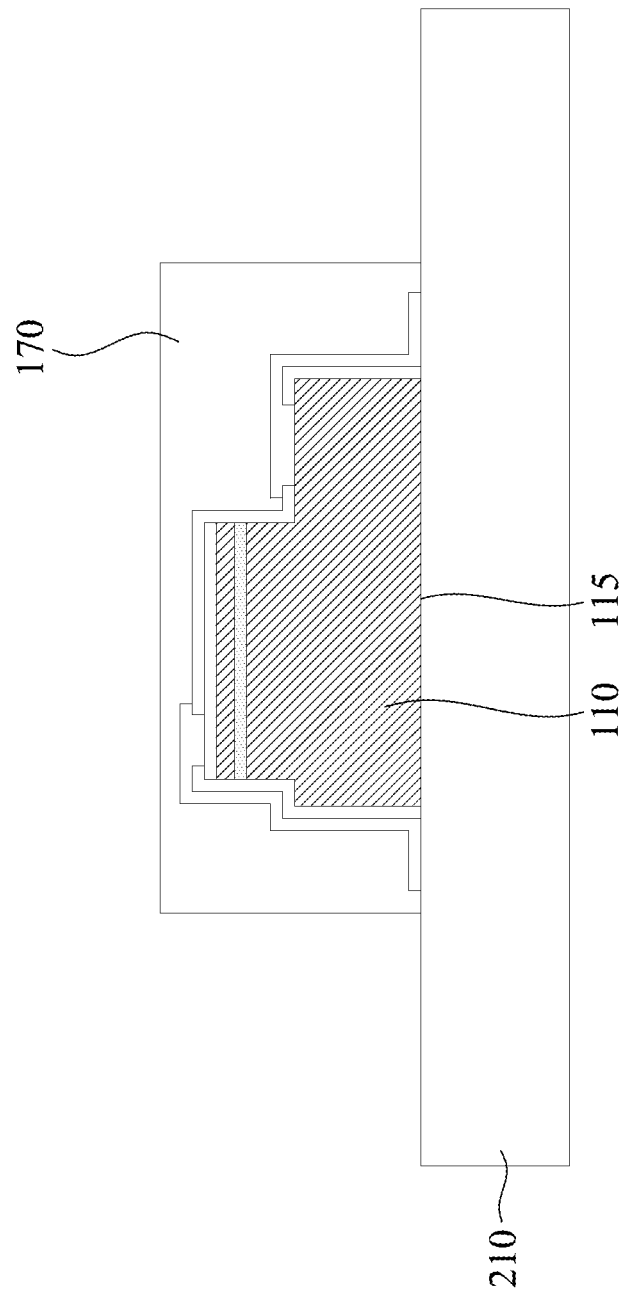

Returning to FIG. 2 and referring to FIG. 3B, in the operation 330, the housing layer 170 is arranged to cover the micro LED chip 110 and the components is located on the bottom surface and the side surface thereof. Accordingly, the housing layer 170 substantially covers the micro LED chip 110, and the electrical connecting layer 150, the electrical connecting layer 160, the housing layer 170 and the micro LED chip 110 form a light-emitting device 100. The light exit surface 115 of the light-emitting device 100 is still connected to the bottom plate 210.

Figure 3C:
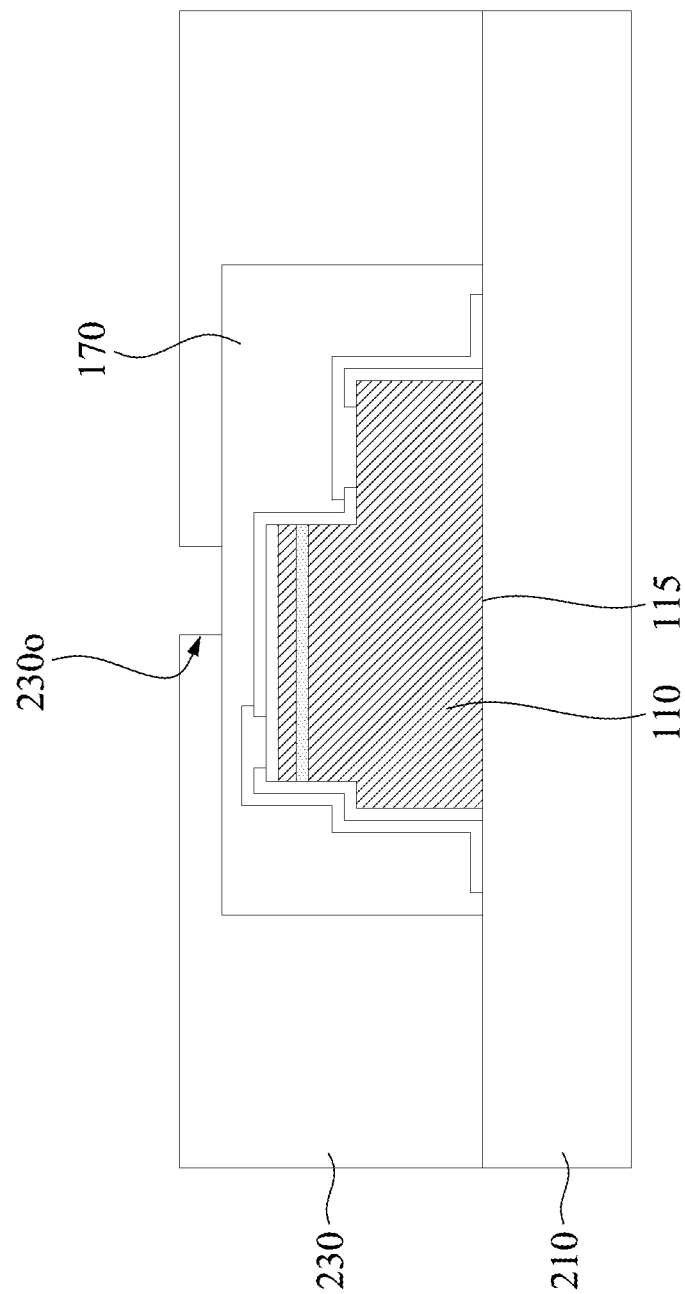

Continued with operation 330, in operation 340, further configure a sacrificial layer 230 covering the housing layer 170. The sacrificial layer 230 has an opening 230o extending from the housing layer 170 to the sacrificial layer 230. Therefore, the housing layer 170 is exposed as shown in FIG. 3C. In some embodiments, the material of the sacrificial layer 230 is Lift Off Resist (LOR for short), which facilitates removal in a subsequent operation.

Figure 3D:
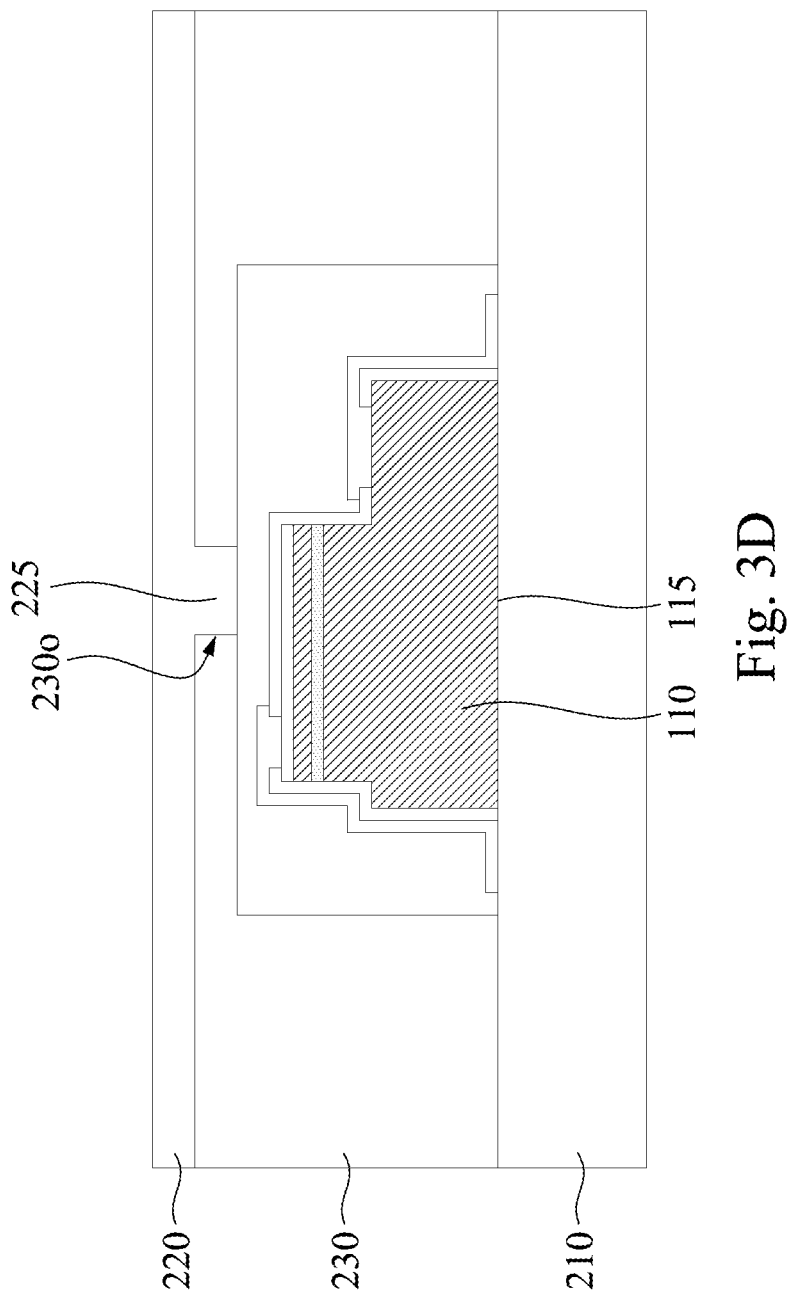

In the operation 350 and referring to FIG. 3D, provide a supporting structure layer 220 covering the sacrificial layer 230 and filling the opening 230o, wherein a portion of the supporting structure layer 220 filled into the opening 230o forms a columnar supporting structure 225. The support structure 225 connects to the housing layer 170. The support structure 225 can be used to support the light-emitting device 100 (referring to the following discussion). In some embodiments, the material used for the support structure layer 220 includes silicon dioxide ($SiO_2$).

Continued with operation 350, in the operation 360, connect a second bottom plate 250 to the supporting structure layer 220 through the connecting layer 260, as shown in FIG. 3E. In this embodiment, the bottom plate 250 is connected to the supporting structure layer 220 through connecting layer 260 attaching. In some embodiments, the bottom plate 250 is a sapphire substrate.

Figure 3F:
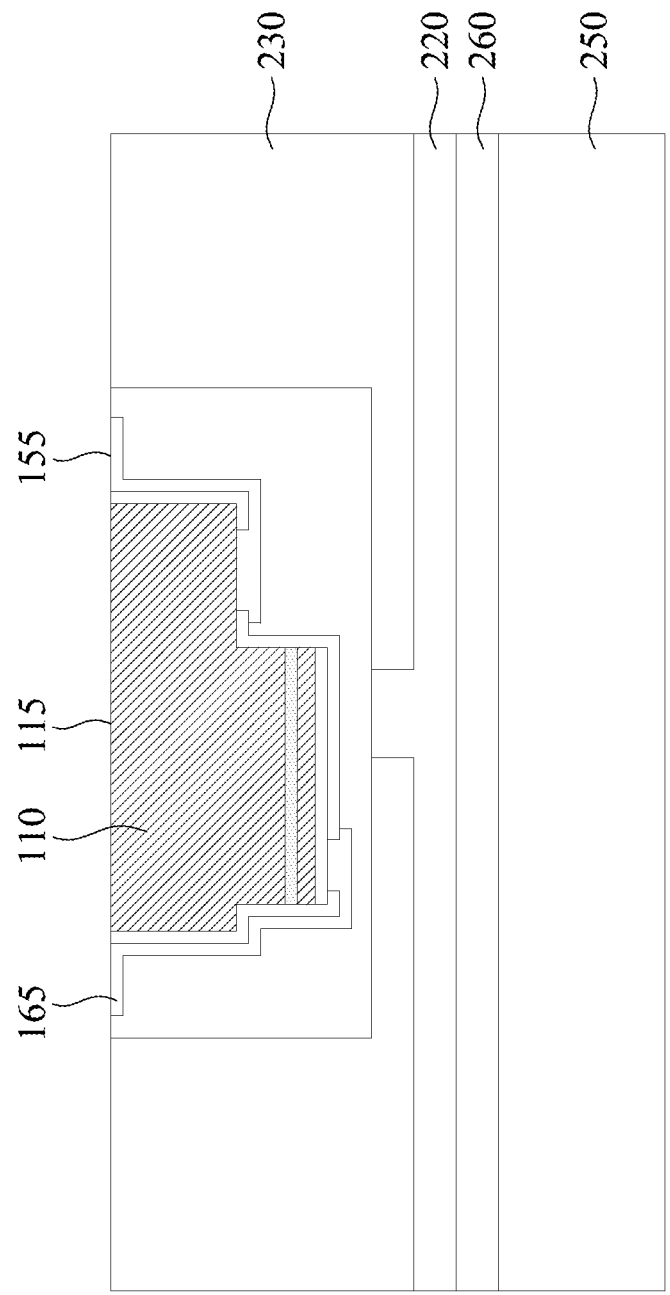

In operation 370, as shown in FIG. 3F, after turning over so that the light exit surface 115 faces upward, the bottom plate 210 is removed. The light exit surface 115, the conductive pad 155 and the conductive pad 165 are no longer connected to the bottom plate 210, and the light exit surface 115 and top surfaces of the conductive pad 155 and the conductive pad 165 can be exposed.

Figure 3G:
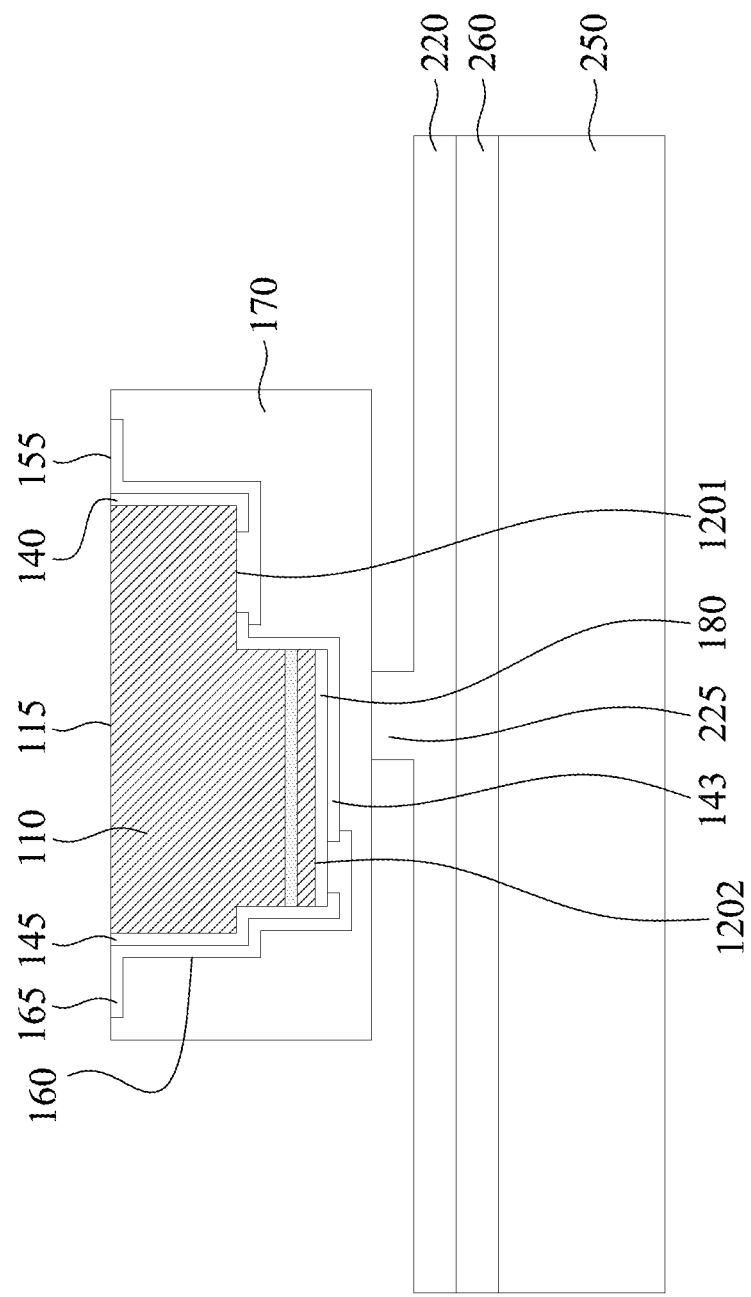

In operation 380, as shown in FIG. 3G, remove the sacrificial layer 230. As mentioned above, the sacrificial layer 230 can be lift off resist (LOR). Therefore, the sacrificial layer 230 can be removed without damaging the light-emitting device 100. In FIG. 3G, substantially only the breakable support structure 225 on the support structure layer 220 is used to connect the bottom plate 250 and the bottom surface of the housing layer 170 of the light-emitting device 100. The cross-section view of FIG. 3G corresponds to the light-emitting structure 200 of FIG. 1B.

Figure 3H:
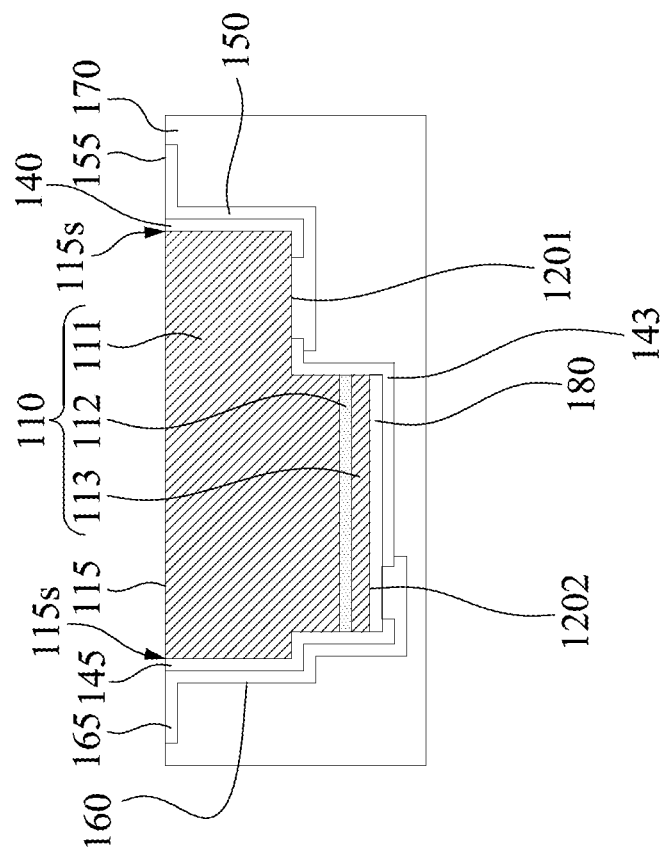

In some embodiments, the housing layer 170 of the light-emitting device 100 can be disconnected from the supporting structure 225, so that the light-emitting device 100 can be separated from the bottom plate 250, as shown in FIG. 3H. Then, the light-emitting device 100 can be transferred to another circuit board including a receiving substrate with circuits used for a package device (such as the circuit board 410 shown in FIG. 7A). There are many ways to transfer the light-emitting device 100. For example, a pickup device (not shown in the figure) can be provided to pick up the light-emitting device 100 to a substrate to be received. Since the support structure 225 is easily broken, and the pickup device can break the supporting structure 225 during picking up the light-emitting device 100.

To improve the light-emitting efficiency of the micro LED chip 110 or adjust the light-emitting angle, the light exit surface 115 of the micro LED chip 110 can have a roughened surface or a different shape. For details, please refer to following embodiments shown in FIGS. 4-6.

Figure 4:
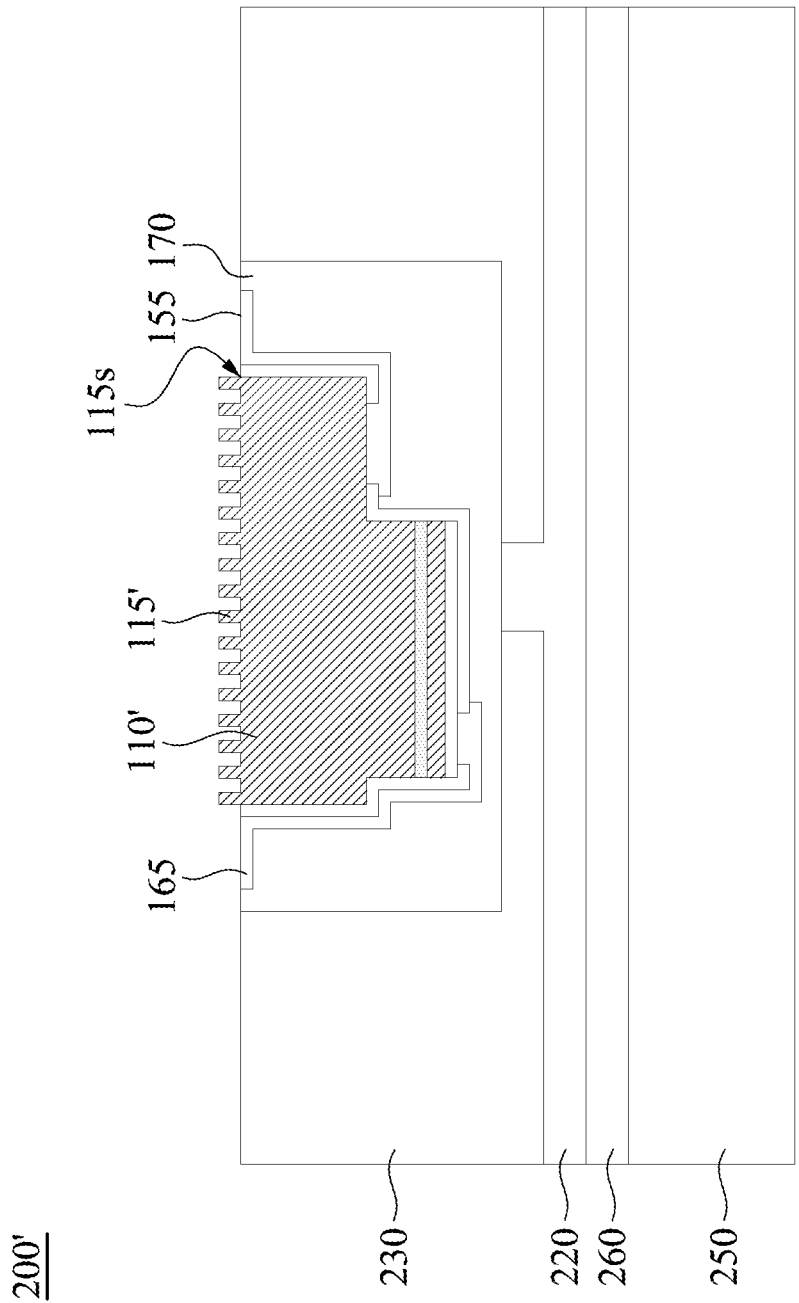
FIG. 4 illustrates a cross-section view of another light-emitting structure according to another embodiment of the present disclosure.

FIG. 4 illustrates a cross-section view of a light-emitting structure 200' according to one embodiment of the present disclosure. The difference between the light-emitting structure 200' of FIG. 4 and the light-emitting structure 200 of FIG. 1B is that the shape of the light exit surface 115' of the micro LED chip 110' of the light-emitting device 100. In FIG. 4, the light exit surface 115' has a plurality of raised microstructures. In other words, the light exit surface 115' has a roughened surface. Therefore, the total reflection mechanism on the light exit surface 115' can be destroyed, thereby increasing the light-emitting efficiency and improving the emitting illumination profile and light-emitting angle.

Figure 5:
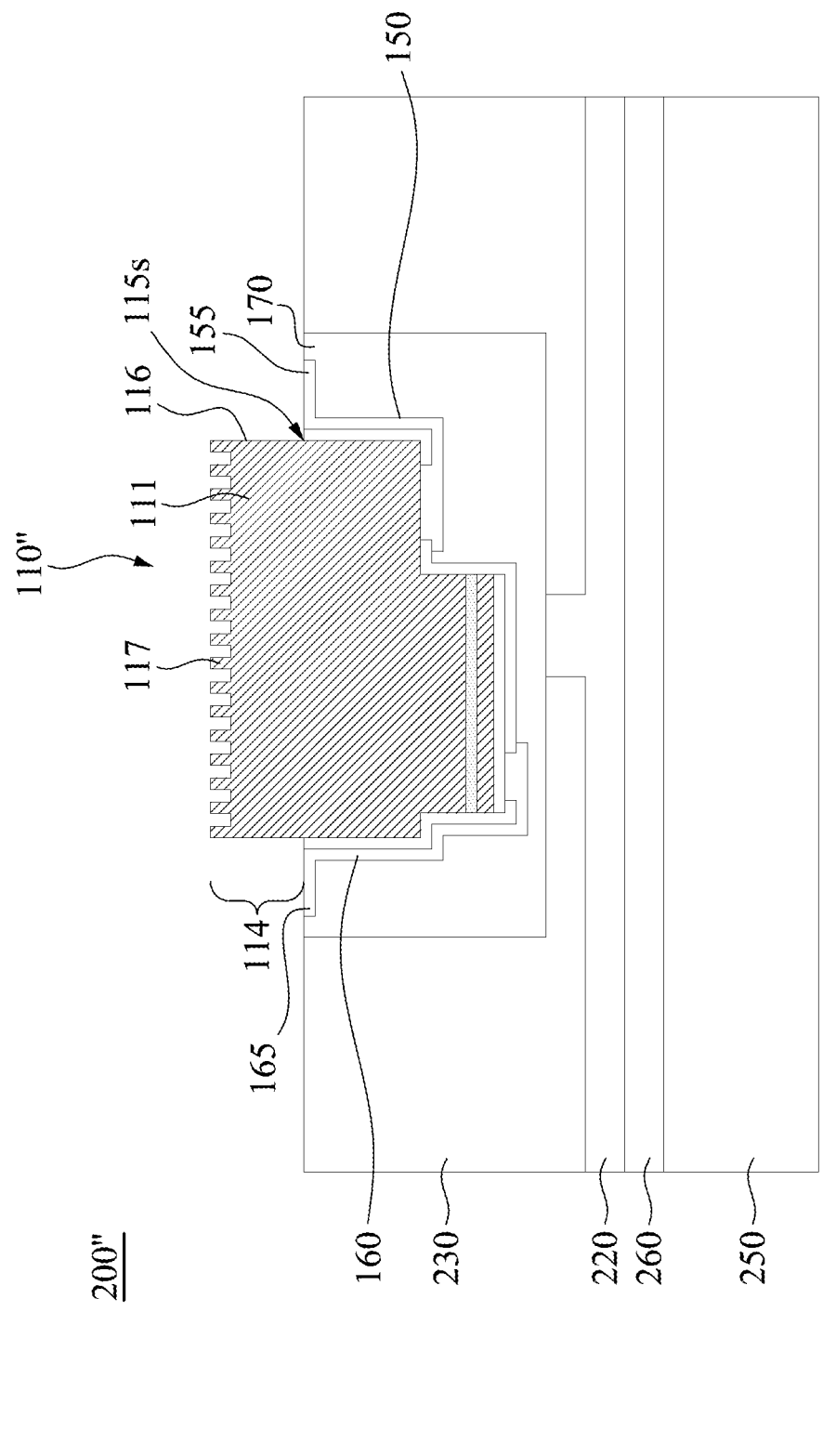
FIG. 5 illustrates a cross-section view of another light-emitting structure according to another embodiment of the present disclosure.

FIG. 5 illustrates a cross-section view of another light-emitting structure 200" according to another embodiment of the present disclosure. The difference between the light-emitting structure 200" of FIG. 5 and the light-emitting structure 200 of FIG. 1A is also in the shape of the light exit surface 115" of the micro LED chip 110" of the light-emitting device 100. In FIG. 5, the micro LED chip 110" has a protruding structure 114 protruding from the peripheral edge 115s of the connecting insulating layer and the electrical connecting layer. The protruding structure 114 is a part of the first semiconductor layer 111 and has a height different from the electrical connecting layer including the electrical connecting layers 150 and 160 and the corresponding conductive pads including the conductive pads 155 and 165. The light exit surface 115" is located on the exposed surface of the protruding structure 114. As shown in FIG. 5, the light exit surface 115" includes the side surface 116 and a roughened surface 117 of the first semiconductor layer 111. The roughened surface 117 is connected to the peripheral edge 115s through the side surface 116 of the first semiconductor layer 111. It makes the light exit surface 115", the conductive pad 155 and the conductive pad 165 are facing to the same direction and exposed, and the light exit surface 115" including the side surface 116 and the roughened surface 117 on the protruding structure 114 has a different height with respect to the conductive pads 155 and 165. In FIG. 5, the roughened surface 117 is substantially located on the portion corresponding to the vertical projection of the bottom surface 120 on the raised structure. In other words, a portion of the protruding structure 114 corresponds to a vertical projection of the bottom surface 120 can be configured as the roughened surface 116a of the light-emitting surface 115", so as to enhance the light emission and improve the illumination profile. The side surface 116b of the protruding structure 114 can be configured with or without a roughened surface according to requirements.

Figure 6:
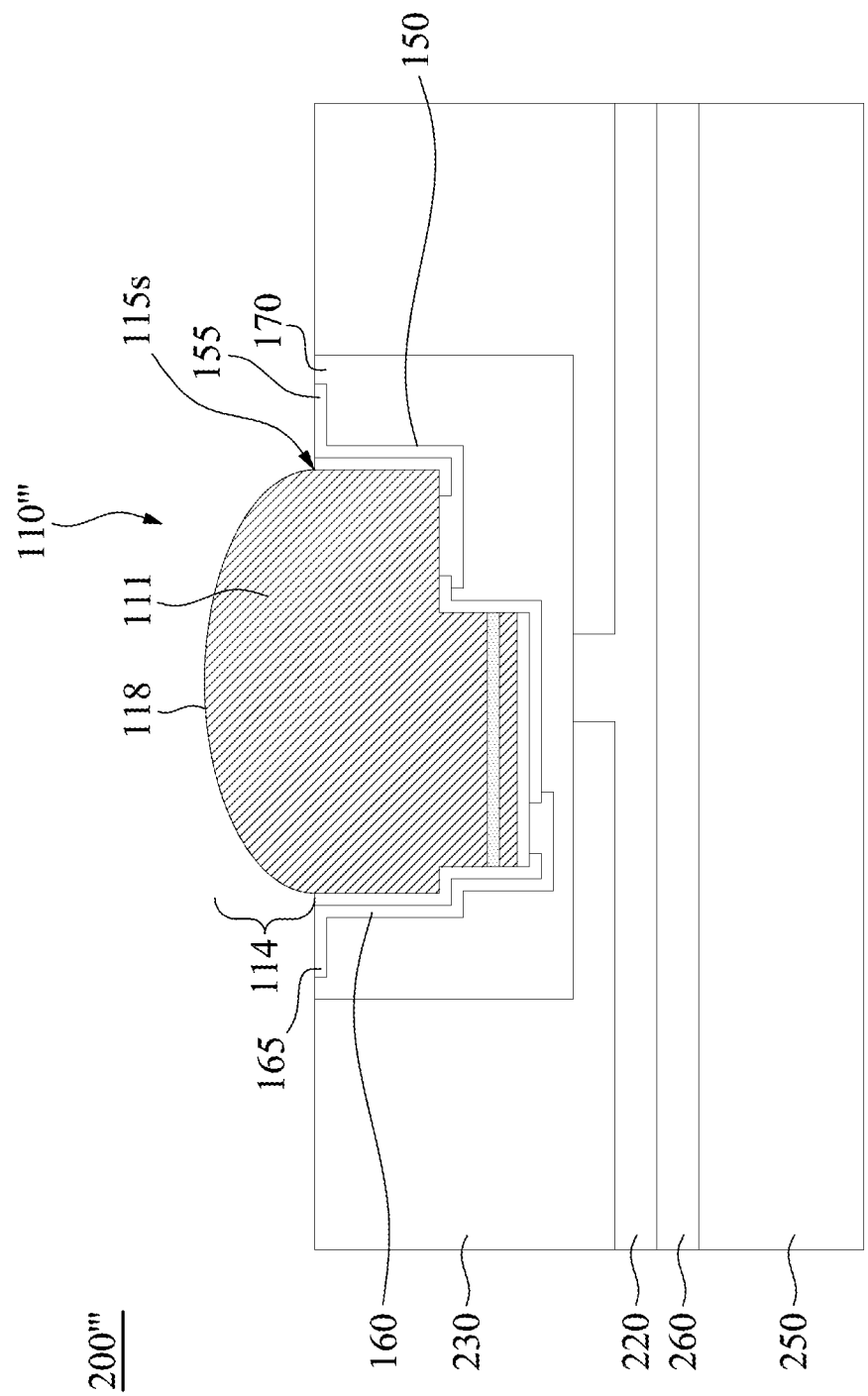
FIG. 6 illustrates a cross-section view of another light-emitting structure according to another embodiment of the present disclosure.

FIG. 6 illustrates a cross-section view of another light-emitting structure 200''' according to another embodiment of the present disclosure. The difference between the light-emitting structure 200''' of FIG. 6 and the light-emitting structure 200 of FIG. 1A is also in the shape of the light-emitting surface 115''' of the micro LED chip 110''' of the light-emitting device 100. In FIG. 6, the micro LED chip 110''' has a protruding structure 114 protruding from the peripheral edges 115s. The protruding structure 114 is a portion of the first semiconductor layer 111 and has a height different from the electrical connecting layers 150, 160 and the corresponding conductive pads 155, 165. The light exit surface 115''' is the surface of the protruding structure 114 and further includes a curved surface 118. The curved surface 118 connects the peripheral edge 115s. It makes the light exit surface 115'''. The conductive pad 155 and the conductive pad 165 are facing the same direction and exposed. The convex curved surface 118 of the light exit surface 115''' has a different height with respect to the conductive pad 155 and the conductive pad 165. The curved surface 118 of the light exit surface 115" can also change the light output, thereby improving the emitting illumination profile.

Similar to FIGS. 3G and 3H, the sacrificial layer 230 in FIGS. 4-6 can be removed later, leaving the support structure layer 220 to connect the housing layer 170 and the bottom plate 250, and finally disconnect the support structure 225 to separate the light-emitting device from the bottom plate 250. Then, the formed light-emitting device 100 can be transferred to a receiving circuit board. For example, a light-emitting device can be applied to a packaged device, so that the light-emitting device can be transferred to a circuit board used for a packaged device. The following FIGS. 7A-7C, FIG. 8, FIGS. 9A-9D and FIGS. 10A-10C further illustrate package devices with the mentioned light-emitting device.

Figure 7A:
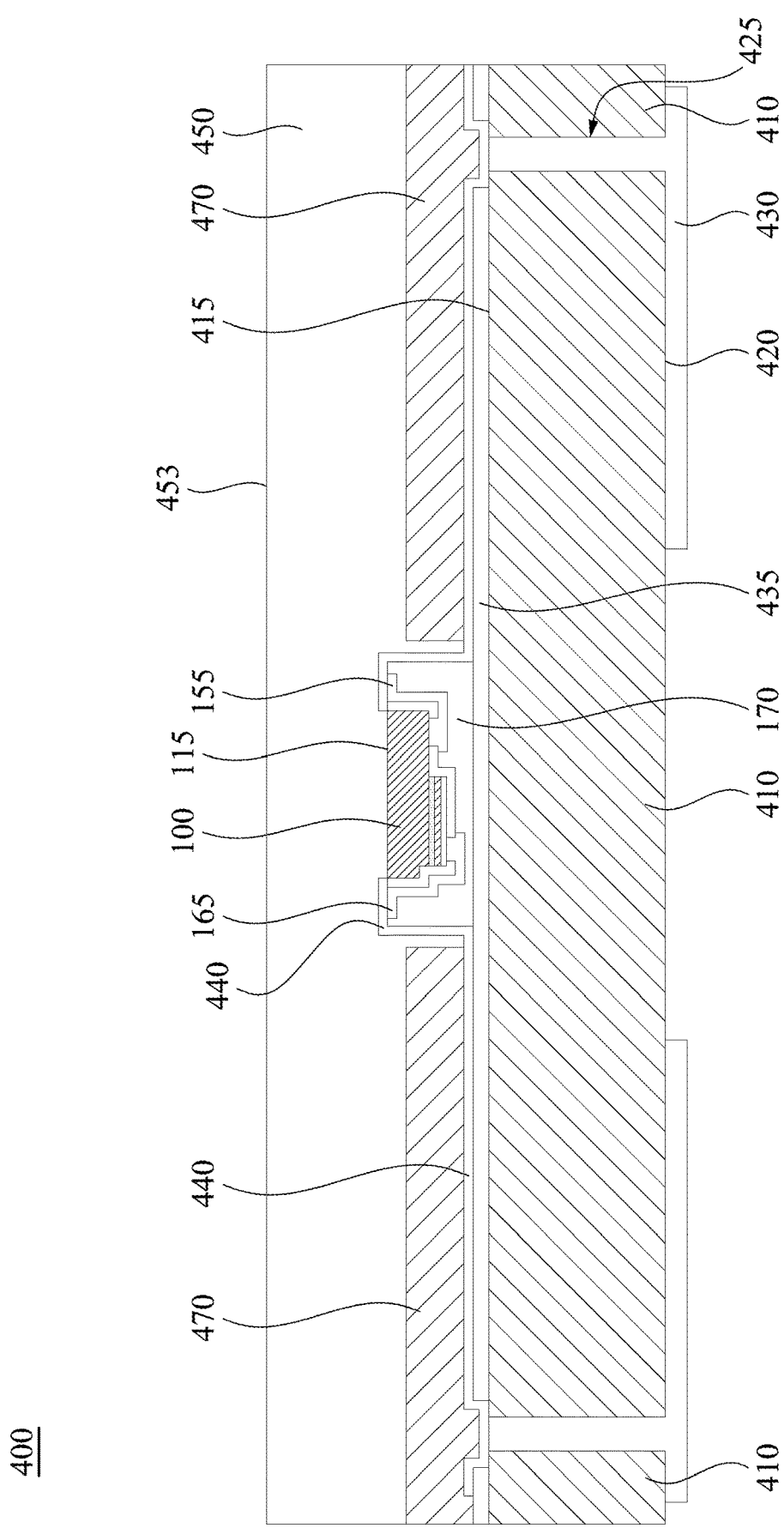
FIG. 7A illustrates a cross-section view of a package device having a light-emitting device according to one embodiment of the present disclosure.

Reference is made by FIG. 7. FIG. 7A illustrates a cross-section view of a package device 400 having a light-emitting device 100 according to one embodiment of the present disclosure. As shown in FIG. 7, the package device 400 includes the mentioned light-emitting device 100. The light-emitting device 100 is, for example, the light-emitting device 100 illustrated in FIG. 1A. In some embodiments, the package device 400 can include more than one light-emitting device 100. For the purpose of simple description, the cross-section shown in FIG. 7A illustrates only one light-emitting device 100.

In this embodiment, the package device 400 further includes a circuit board 410 and a protecting layer 450. The circuit board 410 includes an upper surface 415 and a lower surface 420 opposite to each other. The light-emitting device 100 is located on the upper surface 415 of the circuit board 410. The protecting layer 450 covers the light exit surface 115 of the micro LED chip 110 of the light-emitting device 100. The housing layer 170 of the light-emitting device 100 is located between the micro LED chip 110 and the upper surface 415 of the circuit board 410. In this embodiment, the protecting layer 450 further covers the circuit board 410. In this embodiment, the protecting layer 450 can be a transparent material.

The package device 400 can integrate one or more light-emitting devices 100. In some embodiments, the material of the circuit board 410 can be with a dark or black BT (Bismaleimide Triazine) carrier board to prevent the circuit layer 440 on the surface of the circuit board 410 from being exposed. For example, as shown in FIG. 7B, the package device 400 includes three light-emitting devices 1001, 1002, and 1003 that emit red, green, and blue light, respectively. The three light-emitting devices 1001, 1002, and 1003 can be used as pixels of an LED display. In some embodiments, the circuit board 410 is black BT board, which can be used to improve the contrast of the LED display.

Circuit layers 440 and 430 are respectively located on an upper surface 415 and a lower surface 420 of the circuit board 410, and the circuit board 410 has a plurality of conductive through holes 425. The conductive through holes 425 penetrates the circuit board 410 to electrically connect the circuit layers 440 and 430 on the upper surface 415 and the lower surface 420 of the circuit board 410. The conductive material can fill the conductive via 425, and the conductive material extends to the lower surface 420 of the circuit board 410. The circuit layer 430 on the lower surface 420 of the circuit board 410 can be electrically connected to other components located on the upper surface 415 of the circuit board 410 through the conductive through holes 425, such as the light-emitting device 100. As shown in FIG. 7A, in the package device 400, the circuit layer 440 is located on the upper surface 415 of the circuit board 410 and contacts the conductive through holes 425, and the circuit layer 440 extends along two sides of the housing layer 170 of the light-emitting device to a top surface of the electrical connecting layer 100. That is, the circuit layer 440 is respectively connected to the top surfaces of the conductive pad 155 and the conductive pad 165, so the conductive pad 155 and the conductive pad 165 would be electrically connected to the conductive through hole 425 through the circuit layer 440, and then the circuit layer 440 is electrically connected to the circuit layer 430 on the lower surface 420 of the circuit board 410 through the conductive material in the conductive through hole 425.

An adhesive layer 435 is located on the circuit board 410, so that the housing 170 of the light-emitting device 100 can be fixed on the circuit board 410 through the adhesive layer 435. With the protection of the housing layer 170, the micro LED chip 110 inside the light-emitting device 100 would not be damaged by the adhesive layer 435.

Further, in this embodiment, the package device 400 can further include an opaque layer 470 according to requirements. In FIG. 7A, the opaque layer 470 is located between the protecting layer 450 and the circuit board 410, and the opaque layer 470 does not cover the light-emitting device 100. The opaque layer 470 is mainly used to cover the circuit layer 440 on the surface of the circuit board 410, thereby avoiding the exposure of the circuit layer 440 and reflecting the light from the outside of the package device 400. In this embodiment, the material of the opaque layer 470 is a dark or black material, such as black poly resin (Black PR). For example, as shown in FIG. 7B, the packaged device 400 includes three light-emitting devices 1001, 1002, 1003 that emit red, green and blue light, respectively. When the packaged device 400 is applied to an LED display screen, the opaque layer 470 can enhance the contrast of the package device 400.

FIG. 7A illustrates a package device 400 with a light-emitting device 100. The light-emitting device 100 is located on the upper surface 415 of the circuit board 410 through the adhesive layer 435. The conductive pad 155 and the conductive pad 165 of the light-emitting device 100 are connected to the conductive through hole 425 on the circuit board 410 through the circuit layer 440, so as to be connected to the circuit layer 430 on the lower surface 420 of the circuit board 410. The opaque layer 470 covers the circuit layer 440 but does not cover the light-emitting device 100. The protecting layer 450 covers the light-emitting device 100, the opaque layer 470 and the circuit board 410. Therefore, the light-emitting device 100 emits light through the light exit surface 115, and the emitted light passes through the top surface 453 of the protecting layer 450 to perform a light-emitting or composite display effect.

In this embodiment, since the light-emitting device 100 is with the micro LED chip 110 that does not require a substrate, the overall thickness of the light-emitting device 100 can be less than 20 µm. In some embodiments, the thickness of the circuit board 410 can be about 200 µm. In some embodiments, the thickness of the adhesive layer 435 can be about 10 µm. In some embodiments, the thickness of the opaque layer 470 can be in a range from about 2 µm to 3 µm. In some embodiments, the thickness of the protecting layer 450 is about 50 µm. Therefore, in some embodiments, the overall thickness of the package device 400 can be approximately in a range from 270 µm to 300 µm.

In some embodiments, the area of the circuit board 410 can be approximately 450 um times 450 um, and one or more small-volume light-emitting device 100 can be located on thereof.

Figure 7C:
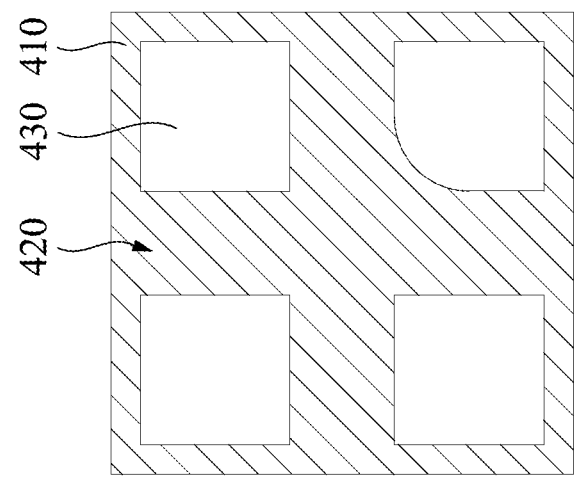
FIG. 7C illustrates a bottom view of the package device of FIG. 7B.
Figure 7B:
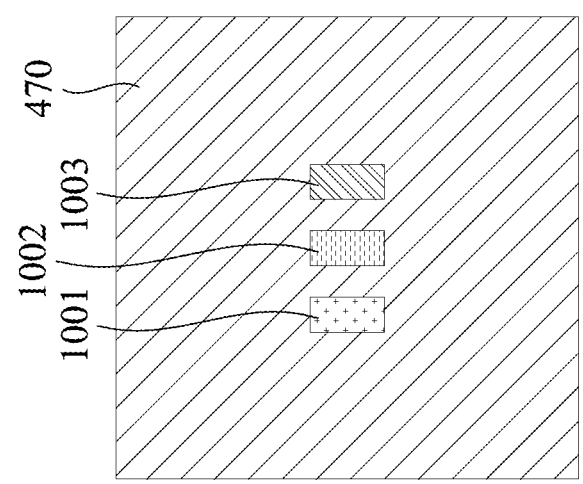
FIG. 7B illustrates a top view of a package device having a plurality of light-emitting devices according to one embodiment of the present disclosure.

Reference is made by FIGS. 7B and 7C. FIG. 7B illustrates a top view of a package device 400 having a plurality of light-emitting devices 1001, 1002 and 1003 according to one embodiment of the present disclosure. FIG. 7C illustrates a bottom view of the package device 400 of FIG. 7B. For the purpose of illustration, the protecting layer 450 is not shown in the figure. For the specific structure of the package device 400 of FIG. 7B, refer to the cross-sectional view along the conductive through hole 425—the light-emitting device 100—the conductive through hole 425 shown in FIG. 7A.

In FIG. 7B, the packing device includes the light-emitting devices 1001, 1002, and 1003. For example, the light-emitting devices 1001, 1002, and 1003 can respectively emit red light, green light, and blue light. Therefore, since the size of the package device of the present disclosure is small enough, the package device of FIG. 7B can be used as a pixel for application on the LED display screen. The traces of the light-emitting devices 1001, 1002, and 1003 are covered by an opaque layer 470. FIG. 7C depicts the lower surface 420 of the circuit board 410 where the light-emitting devices 1001, 1002, and 1003 are a light exit on, and the lower surface 420 is provided with a circuit layer 430 that can be used to connect to other circuits. Referring to FIGS. 7A and 7C, it can be understood that in FIG. 7C, the circuit layer 430 on the lower surface 420 is substantially connected to the circuit layer 440 on the upper surface 415 through the conductive through hole 425. In this embodiment, the circuit layer 440 connected to the light-emitting device 1001, 1002 and 1003 is covered by the opaque layer 470.

Figure 8:
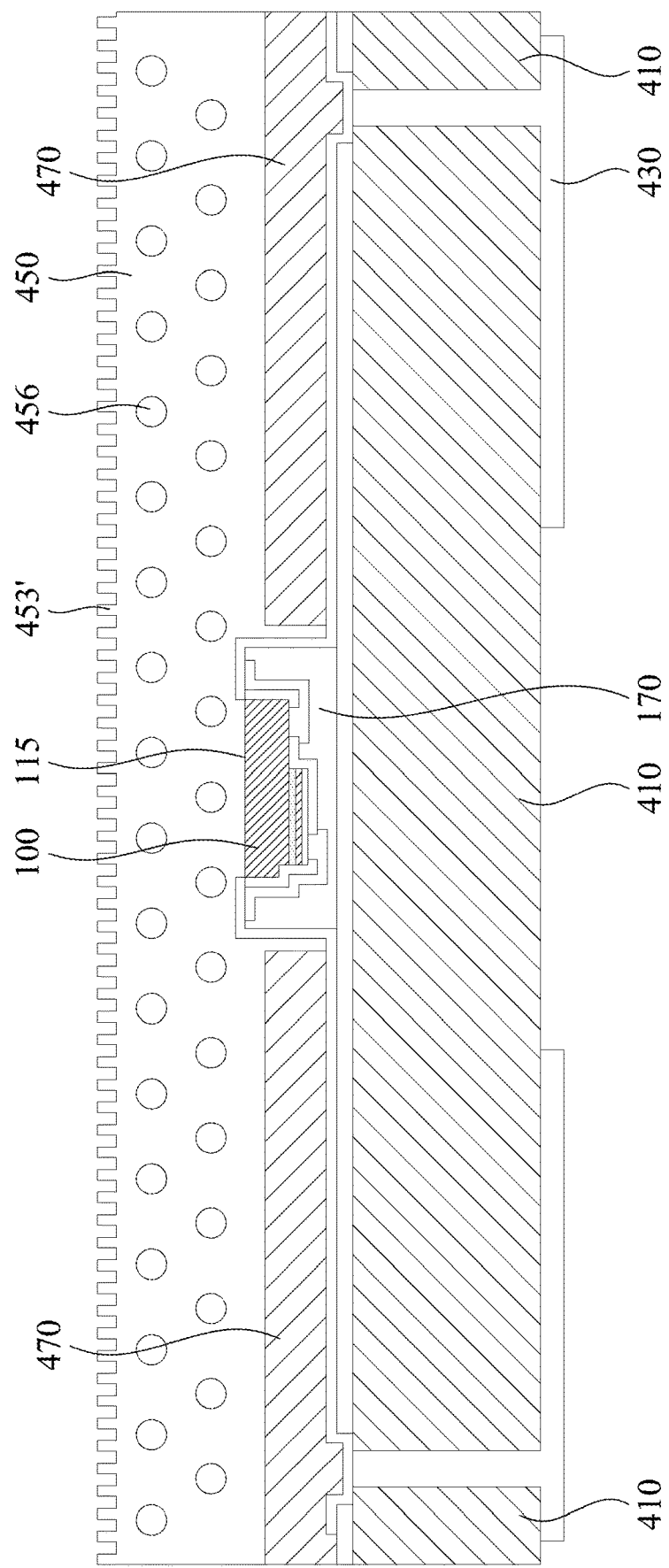
FIG. 8 illustrates a cross-section view of another package device having a light-emitting device according to another embodiment of the present disclosure.

FIG. 8 illustrates a cross-section view of another package device 400' having a light-emitting device 100 according to another embodiment of the present disclosure. The difference between the package device 400 of FIG. 8 and the package device 400 of FIG. 7A is that the protecting layer 450 of the package device 400 of FIG. 8 further includes a roughened top surface 453 and a plurality of micro particles 456 filled therein. For example, the types of micro particles 456 include a plurality of diffusion particles and/or wavelength conversion materials. The protecting layer 450 can be a transparent colloid. In some embodiments, material of the transparent colloid includes polymethyl methacrylate (PMMA), polyethylene terephthalate (PET), polystyrene (PS), poly Ethylene (PP), nylon (polyamide, PA), polycarbonate (PC), polyimide (PI), polydimethylsiloxane (PDMS), epoxy resin and silicone (silicone) or a combination of two or more materials. The diffusion particles can be, for example, titanium dioxide, zirconium oxide, zinc oxide or aluminum oxide, etc., to scatter light and improve the light type or light-emitting angle of the light. The wavelength conversion material is, for example, phosphors or quantum dots, which can convert part of the light emitted by the light-emitting device 100 into another light. The light passing through the roughened top surface 453; will further increase the light extraction efficiency and improve the light emission type or light-emitting angle.

To specifically illustrate the manufacturing process of a package device of the present disclosure, taking the packaged device 400' as an example, please refer to FIGS. 9A to 9D. FIGS. 9A-9D top views in different operations of a method of manufacturing a package device according to one embodiment of the present disclosure.

Figure 9B:
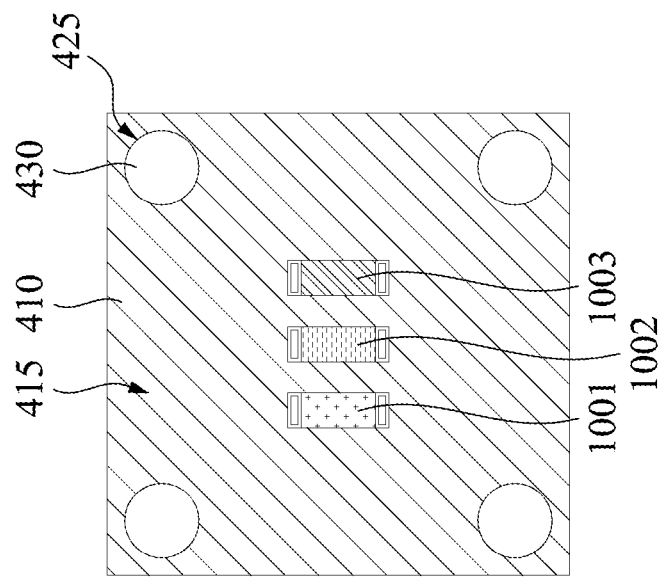
FIGS. 9A-9D top views in different operations of a method of manufacturing a package device according to one embodiment of the present disclosure.
Figure 9A:
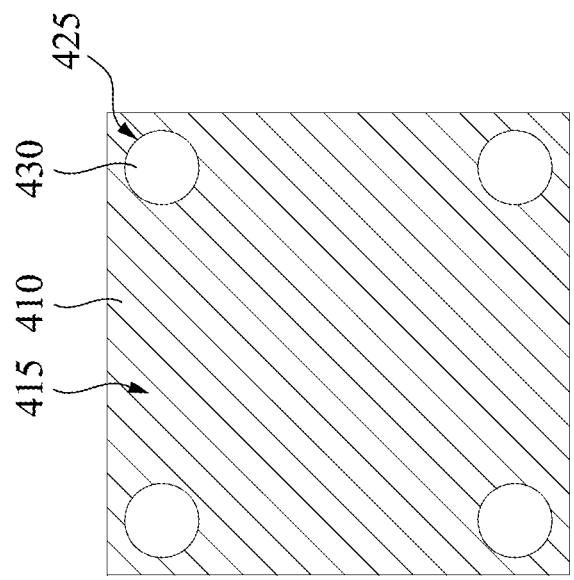

As shown in FIG. 9A, a circuit board 410 is provided. The circuit board 410 is, for example, black. The circuit board 410 has a conductive through hole 425 provided in advance, and the circuit layer 430 located on the lower surface 420 of the circuit board 410 can be connected to the upper surface 415 through the conductive material in the conductive through hole 425.

In FIG. 9B, the light-emitting devices 1001, 1002, and 1003 are respectively located on the upper surface 415 of the circuit board 410. As mentioned above, for the purpose of facilitating electrical connection, the light-emitting device of the present disclosure has two conductive pads 155 and 165 coplanar with the light exit surface of the light-emitting device. These two conductive pads 155 and 165 can be respectively connected to two electrodes of the micro LED chip inside the light-emitting device.

Figure 9D:
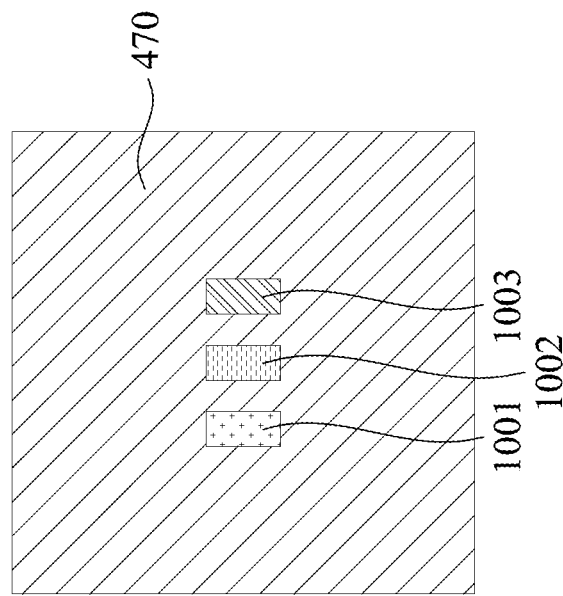
Figure 9C:
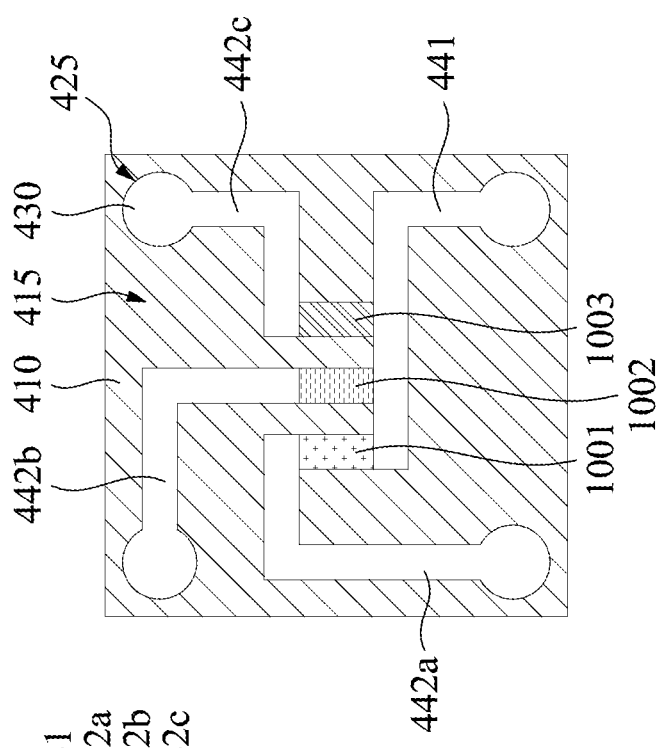

In FIG. 9C, a common first type electrode lead 441 is connected to the top surface of an electrical connecting layer of each light-emitting device 1001, 1002, and 1003. That is, the common first type electrode lead 441 is connected to the conductive pad 155 of each light-emitting device (for example, FIG. 7A), and the common first type electrode lead 441 is connected to one of the conductive through hole 425. The top surfaces of the other electrical connecting layer of the three light-emitting devices 1001, 1002, and 1003 are respectively connected to different conductive through hole 425 through three second-type electrode leads 442a, 442b, and 442c. For example, the common first-type electrode lead 441 is a common n-type electrode lead, the second-type electrode leads 442a, 442b, 442c are p-type electrode leads, the n-type conductive pad 155 of each light-emitting devices 1001, 1002, and 1003 can be connected to a ground terminal through a common first-type electrode lead 441, and the p-type conductive pads 165 of the light-emitting devices 1001, 1002, and 1003 are respectively connected to different electrodes through three second-type electrode leads 442a, 442b, and 442c to be applied different driving signal source.

Continued with FIG. 9C, in FIG. 9D, the opaque layer 470 is arranged to cover the exposed circuit layer 440 on the upper surface 415 including the common first-type electrode leads 441 and the second-type electrode leads 442a, 442b, and 442c, and then a protecting layer can be configured to form a package device mentioned. The formed package device can be the package device shown in FIG. 7B.

FIGS. 10A-10C illustrate top views in different operations of another method of manufacturing a package device according to another embodiment of the present disclosure. Compared with the package device shown in FIG. 9D, in FIGS. 10A to 10C, the package device further includes a driving chip 460. In this embodiment, the driving chip 460 can be used to control a plurality of light-emitting devices 1001, 1002, and 1003, but the present disclosure does not limit the type of the driving chip 460. In some embodiments, a package device of the present disclosure can integrate other types of active elements/devices.

Similar to FIG. 9B, in FIG. 10A, the upper surface 415 of the circuit board 410 is with the light-emitting devices 1001, 1002, and 1003 and conductive through hole 425. The light-emitting devices 1001, 1002, and 1003 can be electrically connected to the circuit layer 430 on the lower surface 420 through the conductive through hole 425. Further, in FIG. 10A, the driving chip 460 is located on the upper surface 415 of the circuit board 410 to control the light-emitting devices 1001, 1002, and 1003. To respectively connect and control the light-emitting devices 1001, 1002, and 1003, the driving chip 460 can have a plurality of electrodes for connecting the light-emitting devices 1001, 1002, and 1003 and a plurality of control electrodes for connecting the conductive through holes 425 one-to-one to receive and control the driving signals of the light-emitting devices 1001, 1002, and 1003.

Similar to the mentioned FIG. 9C, in FIG. 10B, a circuit layer 430 located on the upper surface 415 of the circuit board 410 to connect the conductive through hole 425, the light-emitting devices 1001, 1002 and 1003 and the driving chip 460.

As shown in FIG. 10B, the common first type electrode lead 441 is connected from one of the conductive through hole 425 to a conductive pad of each of the light-emitting devices 1001, 1002, and 1003 and an electrode of the driving chip 460 to realize a multiple-to-one connection to the conductive through hole 425. One electrode of the driving chip 460 can share a common first-type electrode lead 441 with one conductive pad of each of the light-emitting devices 1001, 1002, and 1003. For example, the common first type electrode lead 441 can be connected to a ground terminal.

As shown in FIG. 10B, in this embodiment, the other conductive pads of the light-emitting device 1001, 1002, and 1003 are respectively connected to the corresponding electrodes of the driving chip 460. The driving chip 460 is further connected to different conductive through holes 425 through a plurality of second type electrode leads 442 to realize the circuit layer 440 for controlling functions of the driving chip 460 to control the light-emitting devices 1001, 1002, and 1003.

Similar to the FIG. 9D, in FIG. 10C, an opaque layer 470 is further located on the upper surface 415 of the circuit board 410 to protect the circuit layer 440. The circuit layer 440 includes a common first type electrode lead 441 and a plurality of second type electrode leads 442 respectively connecting the light-emitting devices 1001, 1002, and 1003 to the driving chip 460 and connecting the driving chip 460 to the conductive through hole 425. The common first type electrode lead 441 and the second type electrode leads 442 is covered by the opaque layer 470.

In some embodiments, the circuit board 410 of the package device of the present disclosure can include other types of active devices and multiple light-emitting devices. The number of light-emitting devices is not limited to the number of light-emitting devices depicted in FIGS. 9A-9D or FIGS. 10A-10C. In addition, the electrical connection of the active device can be similar to the connection of the light-emitting device shown in FIG. 1A of the present disclosure. The light-emitting device of FIG. 1A of the present disclosure has two electrical connecting layers respectively connected to two electrodes on the bottom surface of the active device chip and extending to two sides of the top surface along two opposite side walls of the active device chip to form two conductive pads. A housing layer of light-emitting device covers the active device chip and the two electrical connecting layers. The top surface of the active device chip and the top surfaces of the two conductive pads are not covered by the housing layer. Therefore, a conductive pad, which is a top surface of an electrical connecting layer, of an active device chip can share the same common first type electrode lead 441 with a conductive pad of a plurality of light-emitting devices. Another conductive pad of the active device, which is another top surface of the electrical connecting layer, can be connected to another conductive pad of a corresponding light-emitting device through the arrangement of the circuit layer 440, which is similar to FIG. 9C.

Figure 11:
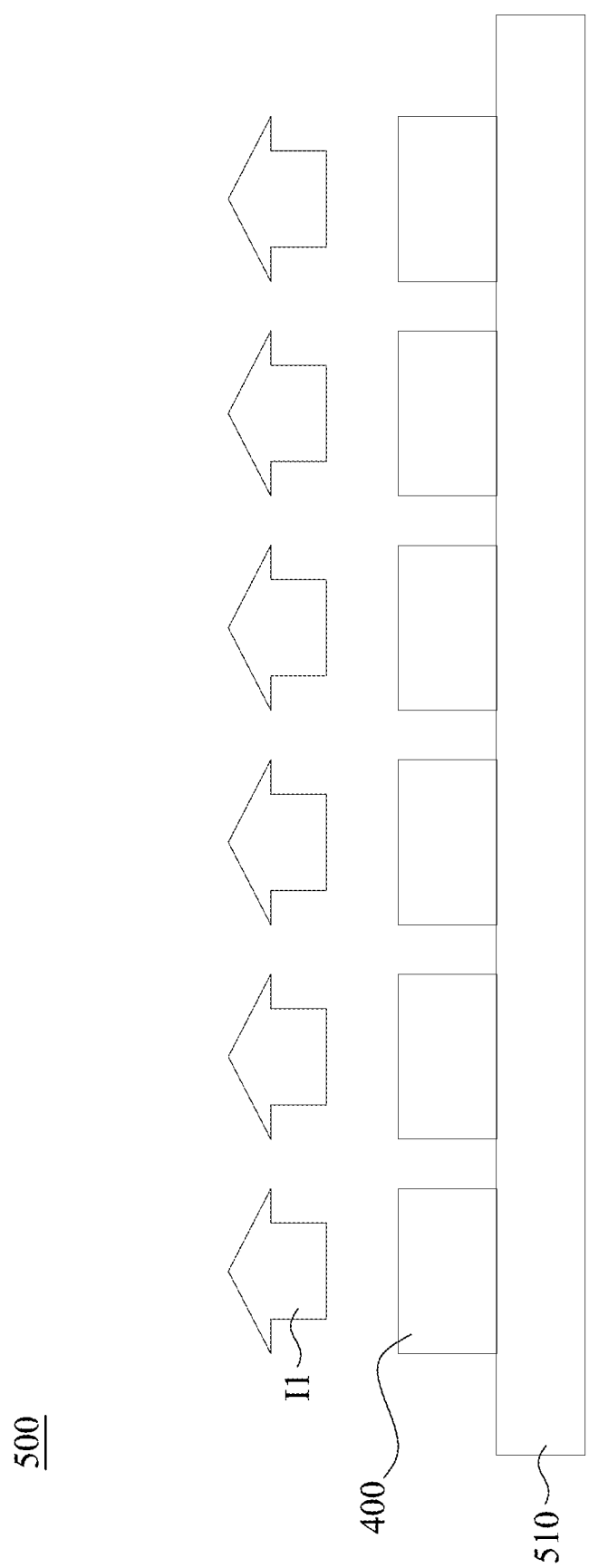
FIG. 11 is a cross-section view illustrating a display module with package devices of the present disclosure.

FIG. 11 is a cross-section view illustrating a display module 500 with package devices 400 of the present disclosure. For the purpose of simple description, the internal structure of the package device 400 is not shown in the figure.

As shown in FIG. 11, a plurality of package devices 400 is arranged on the system carrier board 510. The package device 400 emits light 11. Each package device 400 can be, for example, the package device shown in FIG. 7B, which contains three light-emitting devices 1001, 1002, and 1003 respectively emitting red light, green light, and blue light as pixels of the LED display screen.

Figure 12:
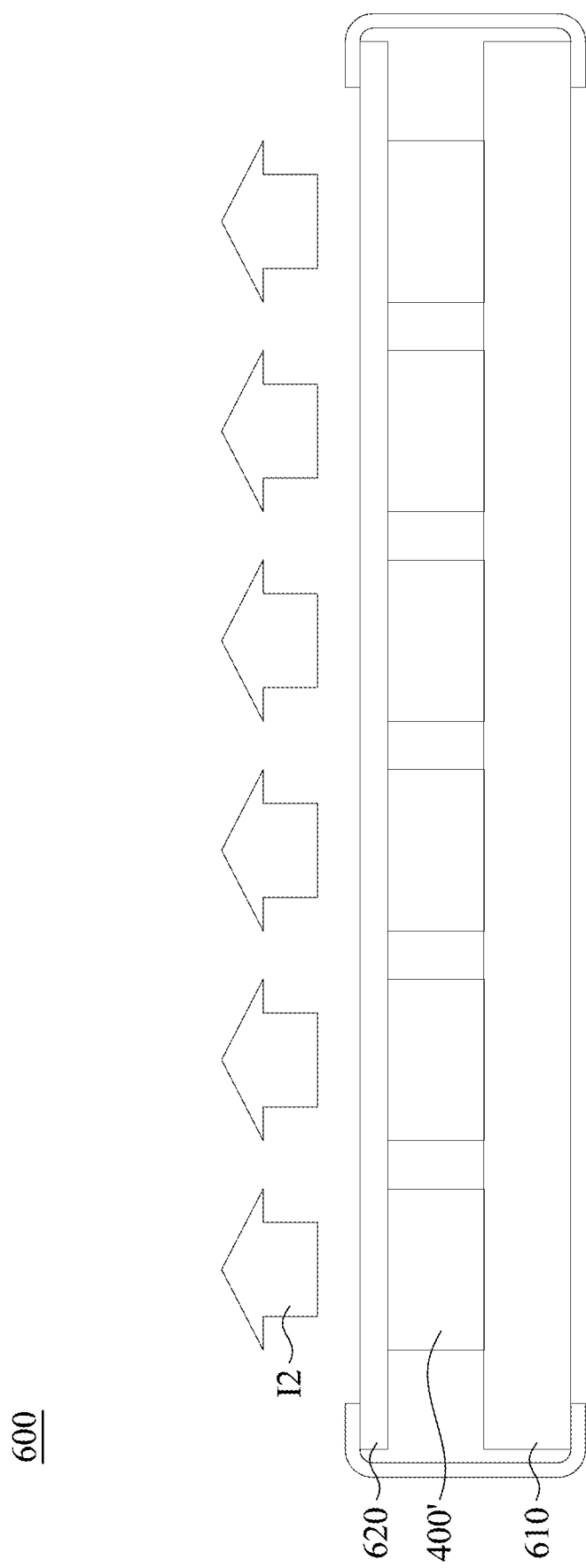
FIG. 12 is a cross-section view illustrating a backlight module with package devices of the present disclosure.

FIG. 12 is a cross-section view illustrating a backlight module 600 with package devices 400' of the present disclosure. For the purpose of simple description, please refer to FIG. 8 for the internal structure of the package device 400'.

As shown in FIG. 12, the backlight module 600 includes a plurality of package devices 400' arranged on the circuit board 610. The package devices 400' emits white light as the light source of the backlight module 600. In one embodiment, the package device 400' includes a light-emitting device 100 that emits blue light, and the micro particles 456 include red and green wavelength conversion materials that absorb part of the blue light and emit red light and green light respectively, and the red light and green light are mixed with the remaining blue light to become white light. In another embodiment, the package device 400' includes a light-emitting device 100 that emits blue light, and the micro particles 456 (as shown in FIG. 8) include a yellow conversion material that absorbs part of the blue light and emits yellow light respectively, and the yellow light is mixed with the remaining blue light to become white light. The white light 12 emitted by the package device 400' is emitted through the optical film 620, and the optical film 620 can further modify the illumination profile of the emitted light 12. The optical film 620 is, for example, a diffuser. In addition, a reflective layer or reflective structure can be located on the surface of the circuit board 610 to reflect the light incident on the circuit board 610.

In summary, the present disclosure provides a light-emitting device with a micro LED, and the electrodes at both ends of the micro LED respectively extend to the peripheral edges on two sides of the light exit surface through electrical connecting layers, which is beneficial to be arranged in other package structures. The present disclosure further provides methods for manufacturing a light-emitting device and a package device using the light-emitting device. The package device can integrate one or more light-emitting devices in a small size, and the package device can be used as a pixel or a light source for emitting light. Further, the package device of the present disclosure can be used in a display module or a backlight module.

The foregoing has described features of several embodiments so that those skilled in the art may better understand the description in various aspects. It will be apparent to those skilled in the art that various modifications and variations can be made to the structure of the embodiments of the present disclosure without departing from the scope or spirit of the present disclosure. In view of the foregoing, it is intended that the present disclosure cover modifications and variations, provided they fall within the scope of the following claims.

What is claimed is:
1. A light-emitting device comprising:
   a micro light-emitting diode chip (micro LED chip) comprising a light exit surface, a bottom surface opposite to the light exit surface and a first electrode and a second electrode located on the bottom surface, wherein the light exit surface comprises a roughened surface, the micro LED chip comprises a protruding structure, and the light exit surface is located on a surface of the protruding structure;

a first electrical connecting layer and a second electrical connecting layer respectively connecting to the first and second electrodes and extending along two opposite sidewalls to two sides of a perimeter of the light exit surface, wherein the protruding structure of the micro LED chip has a height different from a height of the first or second electrical connecting layer; and a housing layer enclosing the micro LED chip and the first and second electrical connecting layers, wherein the light exit surface of the micro LED chip and top surfaces of the first and second electrical connecting layers are not enclosed by the housing layer.

2. The light-emitting device of claim 1, wherein the first and second electrical connecting layers respectively have a first conductive pad and a second conductive pad being coplanar with the light exit surface, and top surfaces of the first and second conductive pads are not enclosed by the housing layer.

3. The light-emitting device of claim 1, wherein the micro LED chip has no substrate.

4. The light-emitting device of claim 1, further comprising a first insulating layer located between the first electrical connecting layer and the micro LED chip and a second insulating layer located between the second electrical connecting layer and the micro LED chip.

5. The light-emitting device of claim 1, wherein the bottom surface comprises a first bottom surface and a second bottom surface, a step height exists between the first and second bottom surfaces, and the first and second electrodes are respectively located on the first and second bottom surfaces.

6. The light-emitting device of claim 1, wherein the bottom surface has a vertical projection on the protruding structure, a portion of the protruding structure corresponding to the vertical projection is the roughened surface.

7. The light-emitting device of claim 1, further comprising:
a bottom plate, and
a breakable supporting structure connecting a bottom surface of the housing layer and the bottom plate, wherein the breakable supporting structure is located between the bottom surface of the housing layer and the bottom plate.

8. A package device, comprising:
a circuit board comprising an upper surface and a lower surface opposite to the upper surface;
at least one light-emitting device located on the upper surface of the circuit board, wherein each of the at least one light-emitting device comprising:
a micro light-emitting diode chip (micro LED chip) comprising a light exit surface, a bottom surface opposite to the light exit surface, and a first electrode and a second electrode located on the bottom surface;
a first electrical connecting layer and a second electrical connecting layer respectively connected to the first and second electrodes and extending along two opposite sidewalls to two sides of a perimeter of the light exit surface; and
a housing layer enclosing the micro LED chip and the first and second electrical connecting layer, wherein the light exit surface of the micro LED chip and top surfaces of the first and second electrical connecting layers are not enclosed by the housing layer; and a protecting layer covering the light exit surface of the micro LED chip, wherein the housing layer of the at least one light-emitting device is located between the micro LED chip of the at least one light-emitting device and a upper surface of the circuit board, and the at least one light-emitting device is electrically connected to the circuit board through the corresponding first and second electrical connecting layers.

9. The package device of claim 8, further comprising:
a driving chip used to control the light-emitting device.

10. The package device of claim 8, wherein a top surface of the protecting layer is opposite to the light exit surface, and the top surface of the protecting layer is a roughened surface.

11. The package device of claim 8, wherein the protecting layer has a plurality of diffusion particles and/or wavelength conversion materials.

12. The package device of claim 8, further comprising:
an opaque layer located between the protecting layer and the circuit board, wherein the opaque layer does not cover the at least one light-emitting device, and the opaque layer is a dark or black material.

13. The package device of claim 8, wherein the circuit board comprises a first circuit layer on the upper surface, and the first circuit layer extends along two sides of the housing layer of the at least one light-emitting device to top surfaces of the first and second electrical connecting layers respectively.

14. The package device of claim 13, wherein the circuit board further comprises a second circuit layer on the lower surface and conductive through holes between the first and second circuit layers.

15. The package device of claim 14, wherein the first circuit layer comprises a common first-type electrode wire and a plurality of second-type electrode wires, and the common first-type electrode wire is insulated form the second-type electrode wires.

16. The package device of claim 15, wherein a number of the at least one light-emitting device is plural, the common first-type electrode wire is connected to the top surfaces of the first electrical connecting layers of the light-emitting devices, and the second-type electrode wires are respectively connected to the top surfaces of the second electrical connecting layer of the light-emitting devices.

17. The package device of claim 16, further comprising at least one active device, wherein the at least one active device is located on the circuit board, each active device comprise third and fourth electrical connecting layers, the common first-type electrode wire connects the third electrical connecting layer of the at least one active device and the first electrical connecting layer of the at least one light-emitting device, the second-type electrode wires respectively connects the fourth electrical connecting layer of the at least one active device and the second electrical connecting layer of the at least one light-emitting device.

18. A method of light-emitting device manufacturing, comprising:
configuring a micro light-emitting diode chip (micro LED chip) on a first bottom plate, wherein the micro LED chip comprises a light exit surface and an opposite bottom surface, the light exit surface is connected to the first bottom plate, and the bottom surface comprises two electrodes;
configuring a first electrical connecting layer and a second electrical connecting layer respectively connected to the two electrodes on the bottom surface, wherein the first and second electrical connecting layer respectively extend to a perimeter of the light exit surface;

configuring a housing layer covering the micro LED chip, wherein the micro LED chip, the first and second electrical connecting layers and the housing layer form a light-emitting device;

configuring a sacrificial layer covering the housing layer, wherein the sacrificial layer has a top surface opposite to the first bottom plate, the sacrificial layer has an opening located on the top surface, the opening is aligned with the micro LED chip, and the opening extends from the top surface of the sacrificial layer to the housing layer;

covering a supporting structure layer on the sacrificial layer and filling the supporting structure layer within the opening to form a supporting structure connected to the housing layer;

connecting a second bottom plate to the supporting structure layer;

removing the first bottom plate to expose the light exit surface; and removing the sacrificial layer such that the light-emitting device is connected to the second bottom plate through the supporting structure of the supporting structure layer.

19. The method of claim 18, further comprising:

disconnecting the housing layer of the light-emitting device and the supporting structure and transferring the light-emitting device to a receiving board.

* * * * *